(12) United States Patent
Egitto et al.

(10) Patent No.: US 7,777,136 B2
(45) Date of Patent: *Aug. 17, 2010

(54) MULTI-LAYERED INTERCONNECT STRUCTURE USING LIQUID CRYSTALLINE POLYMER DIELECTRIC

(75) Inventors: Frank D. Egitto, Binghamton, NY (US); Donald S. Farquhar, Endicott, NY (US); Voya R. Markovich, Endwell, NY (US); Mark D. Poliks, Vestal, NY (US); Douglas O. Powell, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 71 days.

This patent is subject to a terminal disclaimer.

(21) Appl. No.: 11/873,435

(22) Filed: Oct. 17, 2007

(65) Prior Publication Data

US 2008/0217050 A1  Sep. 11, 2008

Related U.S. Application Data

(60) Division of application No. 10/959,711, filed on Oct. 5, 2004, now Pat. No. 7,301,108, which is a division of application No. 10/263,849, filed on Oct. 3, 2002, now Pat. No. 6,826,830, which is a continuation-in-part of application No. 10/067,551, filed on Feb. 5, 2002, now Pat. No. 6,829,823.

(51) Int. Cl.
*H01R 12/04* (2006.01)
*H05K 1/11* (2006.01)

(52) U.S. Cl. .................. 174/262; 174/260

(58) Field of Classification Search .......... 174/260–266
See application file for complete search history.

(56) References Cited

U.S. PATENT DOCUMENTS 4,876,120 A  10/1989  Belke et al.

(Continued)

FOREIGN PATENT DOCUMENTS

JP  03076146  2/1991

(Continued)

OTHER PUBLICATIONS

W.L. Gore & Associates, Inc., "BIAC CC High Performance CLP Laminate", Electronic Material Products; pp. 1-2, (Mar. 22, 2001).

(Continued)

*Primary Examiner*—Ishwarbhai B Patel
(74) *Attorney, Agent, or Firm*—Scully, Scott, Murphy & Presser, P.C.; Joseph Petrokaitis, Esq.

(57) ABSTRACT

A multi-layered interconnect structure and method of formation. In a first embodiment, first and second liquid crystal polymer (LCP) dielectric layers are directly bonded, respectively, to first and second opposing surface of a thermally conductive layer, with no extrinsic adhesive material bonding the thermally conductive layer with either the first or second LCP dielectric layer. In a second embodiment, first and second 2S1P substructures are directly bonded, respectively, to first and second opposing surfaces of a LCP dielectric joining layer, with no extrinsic adhesive material bonding the LCP dielectric joining layer with either the first or second 2S1P substructures.

11 Claims, 14 Drawing Sheets

U.S. PATENT DOCUMENTS

| | | | |
|---|---|---|---|
| 4,882,454 A | 11/1989 | Peterson et al. | |
| 5,072,075 A | 12/1991 | Lee et al. | |
| 5,218,030 A | 6/1993 | Katayose et al. | |
| 5,258,325 A | 11/1993 | Spitzer et al. | |
| 5,346,747 A | 9/1994 | Vancho et al. | |
| 5,352,745 A | 10/1994 | Katayose et al. | |
| 5,426,522 A | 6/1995 | Takahara et al. | |
| 5,477,612 A | 12/1995 | Boberts | |
| 5,517,751 A | 5/1996 | Bross et al. | |
| 5,590,461 A | 1/1997 | Ishida | |
| 5,640,761 A | 6/1997 | DiStefano et al. | |
| 5,677,045 A | 10/1997 | Nagai et al. | |
| 5,719,354 A | 2/1998 | Jester et al. | |
| 5,819,403 A | 10/1998 | Crane, Jr. et al. | |
| 5,821,457 A | 10/1998 | Mosley et al. | |
| 5,822,850 A | 10/1998 | Odaira et al. | |
| 5,824,950 A | 10/1998 | Mosley et al. | |
| 5,830,542 A | 11/1998 | Shigeno et al. | |
| 5,950,306 A | 9/1999 | Suzuki et al. | |
| 6,078,102 A | 6/2000 | Crane, Jr. et al. | |
| 6,092,280 A | 7/2000 | Wojnarowski | |
| 6,108,903 A * | 8/2000 | Nakatani et al. | 29/852 |
| 6,114,005 A | 9/2000 | Nagai et al. | |
| 6,154,940 A | 12/2000 | Onishi et al. | |
| 6,163,957 A | 12/2000 | Jiang et al. | |
| 6,243,946 B1 | 6/2001 | Suzuki et al. | |
| 6,274,242 B1 * | 8/2001 | Onodera et al. | 428/411.1 |
| 6,323,436 B1 | 11/2001 | Hedrick et al. | |
| 6,329,603 B1 | 12/2001 | Japp et al. | |
| 6,351,393 B1 | 2/2002 | Kresge et al. | |
| 6,352,782 B2 | 3/2002 | Yeager et al. | |
| 6,355,504 B1 | 3/2002 | Jiang | |
| 6,373,717 B1 | 4/2002 | Downes, Jr. et al. | |
| 6,388,204 B1 * | 5/2002 | Lauffer et al. | 174/261 |
| 6,465,742 B1 | 10/2002 | Hiraoka et al. | |
| 6,545,353 B2 | 4/2003 | Mashino | |
| 6,580,031 B2 | 6/2003 | Chung | |
| 6,581,280 B2 | 6/2003 | Curcio et al. | |
| 6,602,583 B2 * | 8/2003 | St. Lawrence et al. | 428/209 |
| 6,673,190 B2 | 1/2004 | Haas et al. | |
| 6,708,404 B1 | 3/2004 | Gaku et al. | |
| 6,722,031 B2 | 4/2004 | Japp et al. | |
| 6,745,464 B2 | 6/2004 | Echigo et al. | |
| 6,748,652 B2 | 6/2004 | Andou et al. | |
| 6,764,748 B1 | 7/2004 | Farquhar et al. | |
| 6,774,316 B1 | 8/2004 | Suzuki et al. | |
| 2002/0050402 A1 | 5/2002 | Japp et al. | |

FOREIGN PATENT DOCUMENTS

| | | |
|---|---|---|
| JP | 08097565 | 4/1996 |
| JP | 2002076557 | 3/2002 |
| JP | 20020190549 | 7/2005 |
| JP | 2001237548 | 10/2007 |
| WO | WO9615306 | 5/1996 |

OTHER PUBLICATIONS

W.L. Fore & Associates, Inc. "BIAC LCP Flex Dielectric", Electronic Products Division, Data Sheet; 7246, Issued Jan. 2002 AGS.

W.L. Fore & Associates, Inc. "BIAC LCP Flex Dielectric", Electronic Products Division, Processing Guidelines; 7248, Issued Jan. 2002 AGS.

* cited by examiner

7,777,136 B2

MULTI-LAYERED INTERCONNECT STRUCTURE USING LIQUID CRYSTALLINE POLYMER DIELECTRIC

RELATED APPLICATIONS

This application is a divisional application of Ser. No. 10/959,711, filed Oct. 5, 2004, which application was a continuation-in-part of copending U.S. patent application Ser. No. 10/067,551, filed Feb. 5, 2002 and entitled "Electronic Package For Electronic Components and Method of Making Same."

BACKGROUND OF THE INVENTION

1. Technical Field

The present invention relates, in general, to a multi-layered interconnect structure, and in particular, to the lamination of liquid crystal polymer (LCP) dielectric layers within the multi-layered interconnect structure.

2. Related Art

Organic substrates, such as chip carriers, have been and continue to be developed for many applications. However, it would be desirable to reduce costs and inefficiencies that currently characterize fabrication of organic substrates.

SUMMARY OF THE INVENTION

In first embodiments, the present invention provides a multi-layered interconnect structure, comprising:

a thermally conductive layer including first and second opposing surfaces;

a first liquid crystal polymer (LCP) dielectric layer directly bonded to the first opposing surface of the thermally conductive layer with no extrinsic adhesive material bonding the first LCP dielectric layer to the thermally conductive layer;

a second LCP dielectric layer directly bonded to the second opposing surface of the thermally conductive layer with no extrinsic adhesive material bonding the second LCP dielectric layer to the thermally conductive layer;

a first electrically conductive layer within the first LCP dielectric layer; and a second electrically conductive layer within the first LCP dielectric layer and positioned between the first electrically conductive layer and the thermally conductive layer, wherein the second electrically conductive layer comprises a first plurality of shielded signal conductors.

In second embodiments, the present invention provides a method of making a multi-layered interconnect structure, comprising:

providing a thermally conductive layer including first and second opposing surfaces;

positioning a first liquid crystal polymer (LCP) dielectric layer on the first opposing surface of the thermally conductive layer, wherein the first LCP dielectric layer comprises a first LCP dielectric material, and wherein the first LCP dielectric layer includes a first LCP dielectric sublayer positioned on the first opposing surface of the thermally conductive layer, a first plurality of shielded signal conductors positioned on the first LCP dielectric sublayer, a second LCP dielectric sublayer positioned on the first plurality of shielded signal conductors, a first electrically conductive layer positioned on the second LCP dielectric sublayer, and a third LCP dielectric sublayer positioned on the first electrically conductive layer; and positioning a second LCP dielectric layer on the second opposing surface of the thermally conductive layer; wherein the second LCP dielectric layer comprises a second LCP dielectric material; and subjecting the first and second LCP dielectric layers to a first and second temperature that are less than the nematic-to-isotropic transition temperature of the first and second LCP dielectric materials, respectively, for a dwell time and at an elevated pressure that is sufficient to cause the first and second LCP dielectric materials to plastically deform and to cause: bonding of the first LCP dielectric sublayer to the thermally conductive layer without any extrinsic adhesive layer disposed between the first LCP dielectric sublayer and the thermally conductive layer, and bonding of the second LCP dielectric sublayer to the thermally conductive layer without any extrinsic adhesive layer disposed between the second LCP dielectric sublayer and the thermally conductive layer.

In third embodiments, the present invention provides an electrical structure, comprising:

a first 2S1P substructure, comprising a first dielectric layer, a first power plane within the first dielectric layer, a top signal plane on a top surface of the first dielectric layer, a bottom signal plane on a bottom surface of the first dielectric layer, and a first electrically conductive via;

a second 2S1P substructure, comprising a second dielectric layer, a second power plane within the second dielectric layer, a top signal plane on a top surface of the second dielectric layer, a bottom signal plane on a bottom surface of the second dielectric layer, and a second electrically conductive via; and a joining layer having first and second opposing surfaces and an electrically conductive plug therethrough, wherein the joining layer comprises a liquid crystal polymer (LCP) dielectric material, wherein the first opposing surface of the joining layer is directly bonded to the first dielectric layer of the first 2S1P substructure with no extrinsic adhesive material bonding the joining layer to the first dielectric layer, wherein the second opposing surface of the joining layer is directly bonded to the second dielectric layer of the second 2S1P substructure with no extrinsic adhesive material bonding the joining layer to the second dielectric layer, and wherein the electrically conductive plug electrically couples the first electrically conductive via to the second electrically conductive via.

In fourth embodiments, the present invention provides a method for forming an electrical structure, comprising:

providing a first 2S1P substructure, said first 2S1P substructure comprising a first dielectric layer, a first power plane within the first dielectric layer, a top signal plane on a top surface of the first dielectric layer, a bottom signal plane on a bottom surface of the first dielectric layer, and a first electrically conductive via;

providing a second 2S1P substructure, said second 2S1P substructure comprising a second dielectric layer, a second power plane within the second dielectric layer, a top signal plane on a top surface of the second dielectric layer, a bottom signal plane on a bottom surface of the second dielectric layer, and a second electrically conductive via;

providing a joining layer, said joining layer having first and second opposing surfaces and an electrically conductive plug therethrough, wherein the joining layer comprises a liquid crystal polymer (LCP) dielectric material; and directly bonding the joining layer to the first dielectric layer of the first 2S1P substructure at the first opposing surface and to the second dielectric layer of the second 2S1P substructure at the second opposing surface, by subjecting the first 2S1P substructure, the joining layer, and the second 2S1P substructure to an elevated temperature, elevated pressure, and dwell time sufficient for effectuating said bonding, wherein the elevated temperature is less than the nematic temperature of the LCP dielectric material during the dwell time, wherein no extrinsic adhesive material is disposed between the joining layer and the first dielectric layer, wherein no extrinsic adhesive material is disposed between the joining layer and the second dielectric layer, and wherein the electrically conductive plug electrically couples the first electrically conductive via to the second electrically conductive via.

The present invention advantageously reduces processing time and processing costs, and reduces dielectric layer thickness, in the fabrication of organic substrates

DETAILED DESCRIPTION OF THE INVENTION

Figure 1:
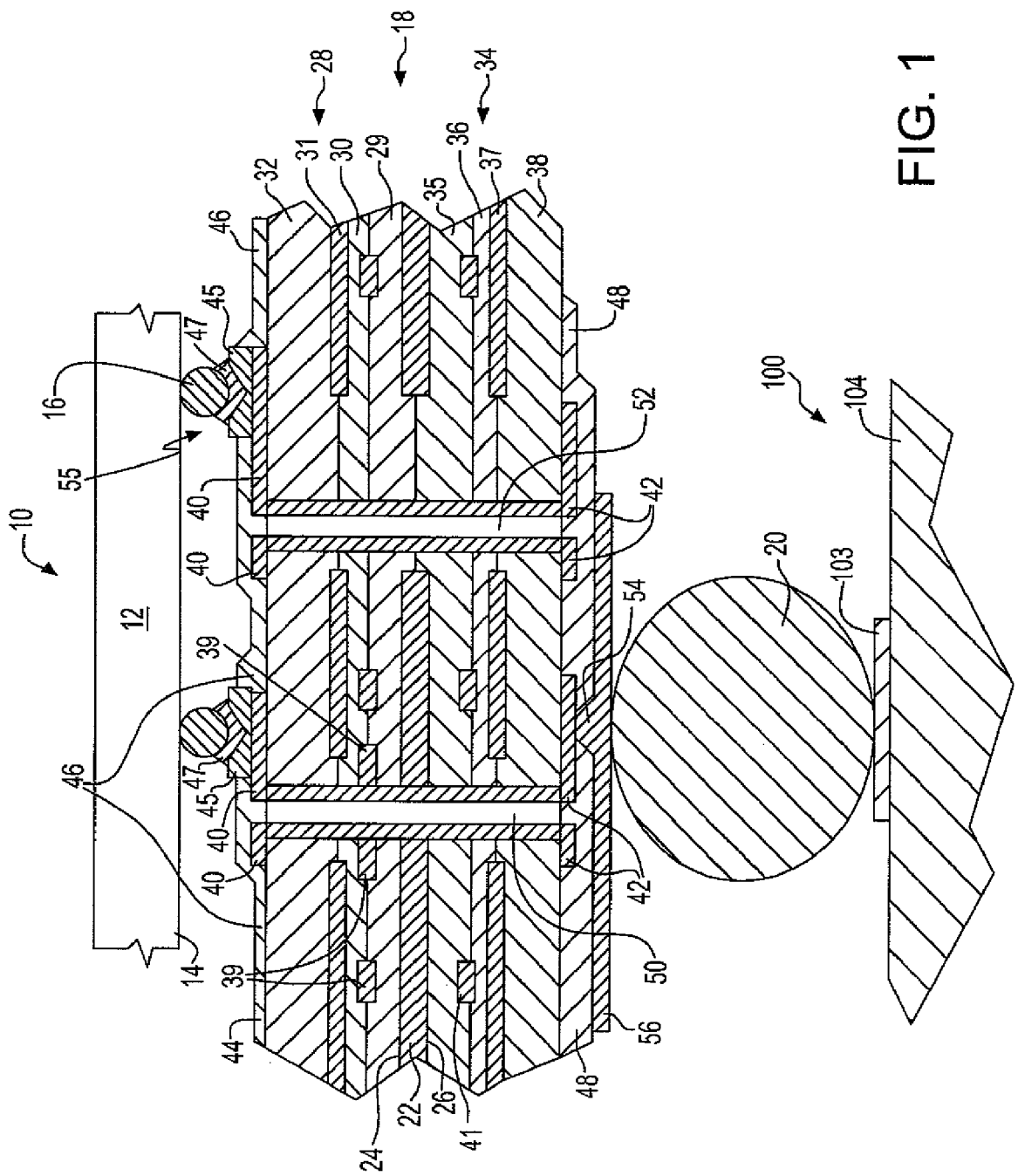
FIG. 1 is a front sectional view of an electronic package that includes a semiconductor chip assembled to a multi-layered interconnect structure, and the multi-layered interconnect structure assembled to a circuitized substrate, in accordance with preferred embodiments of the present invention.

The present invention concerns a multi-layered interconnect structure comprising a dielectric material, and methodology for forming the multi-layered interconnect structure. This Detailed description section is divided into three subsections. The first subsection describes the multi-layered interconnect structure and methodology for its formation in terms of a first dielectric material embodiment ("First Dielectric Material Embodiment"). The second subsection describes the multi-layered interconnect structure and methodology for its formation in terms of a second dielectric material embodiment in which a liquid crystal polymer (LCP) dielectric is utilized ("Second Dielectric Material Embodiment"). The third subsection describes a particularized multi-layered interconnect structure in which a joining layer comprising LCP dielectric material is used to join together two other substructures such as 2S1P substructures ("Joining Layer Embodiment").

First Dielectric Material Embodiment

The present invention provides an electronic package which includes a multi-layered interconnect structure (e.g., a substrate comprising organic dielectric material, such as an organic chip carrier) and a semiconductor chip, the multi-layered interconnect structure being relatively compliant and having a coefficient of thermal expansion (CTE) of about 10 to about 12 ppm/° C. which will not cause failure of interconnections between the semiconductor chip and a printed circuit board to which the package can be assembled. The multi-layered interconnect structure may be comprised of a single layer as an embodiment of the present invention. Failure of an interconnection, such as a solder interconnection, is defined as an increase of at least one ohm in electrical resistance of the interconnection as a consequence of being subjected to each test (i.e., test category) of Thermal Acceptance Testing (TAT), wherein the interconnection is actually tested under each TAT test or is alternatively subjected to engineering calculation or computer simulations which determine, according to accepted engineering standards and methodology, whether the interconnection would experience said increase of at least one ohm in electrical resistance if actually subjected to each TAT test. The electrical resistance of the interconnection prior to TAT is used as a reference value for calculating said increase in electrical resistance following any TAT test. Passing of an interconnection is defined as not failing. Thermal Acceptance Testing includes the following four test categories: an air-to-air test, a wet thermal shock test, a thermal cycle test, and a power cycle test.

The air-to-air test is the Joint Electron Device Engineering Council (JEDEC) test method A104-A, condition G, which includes immersion of the organic substrate with an attached chip in air at −40° C. until both the organic substrate and the attached chip are at −40° C. throughout (typically 10 minutes), followed by immersion in another bath of air at 125° C. until both the organic substrate and the attached chip are at 125° C. throughout (typically 10 minutes), for 1000 cycles.

The wet thermal shock test is the JEDEC test method A106-A, which includes immersion of the organic substrate with an attached chip in a liquid bath at −40° C. until both the organic substrate and the attached chip are at −40° C. throughout (typically 10 minutes), followed by immersion in another liquid bath at 125° C. until both the organic substrate and the attached chip are at 125° C. throughout (typically 10 minutes), for 100 cycles.

The thermal cycle test cycles the whole assembly (organic substrate with attached chip and attached circuit card) in a chamber of air that cycles the air from 0° C. to 100° C. for 3600 cycles, wherein the extreme chamber temperatures of 0° C. and 100° C. are each maintained until the whole assembly reaches a uniform steady-state temperature.

The power cycle test cycles the whole assembly (organic substrate with attached chip and attached circuit card) from 25° C. (i.e., ambient room temperature) to 125° C., for 3600 cycles. During the heating phase, the chip is powered up and serves as the heat source for the whole assembly. The high-temperature end of a cycle occurs when the chip is at 125° C. with a consequent temperature distribution across the entire assembly that is intended to realistically simulate temperature distributions that would occur during actual field operation.

Referring to FIG. 1, a partial sectional view, in elevation, of one embodiment of the electronic package 10 of the invention is shown. The electronic package 10 includes an electronic device, such as a semiconductor chip 12 having a first surface 14, the first surface including a plurality of contact members 16, thereon. The plurality of contact members 16 are preferably Controlled Collapse Chip Connection (C4) solder balls, each coupled to a respective contact (not shown) on the chip's first surface 14. Other contact member shapes that can be used in this invention are columns and cylinders. C4 solder balls are comprised of solder material preferably having a composition of about 97% lead and about 3% tin with a melting point of about 310° C. The electronic package includes a multi-layered interconnect structure 18, preferably an organic chip carrier, adapted for electrically interconnecting the semiconductor chip 12 to an electronic device such as a circuitized substrate 100 (e.g., a printed circuit board) by means of a first plurality of solder connections, preferably solder balls such as ball grid array (BGA) solder balls. The multi-layered interconnect structure 18 (which will be described infra in detail) includes a thermally conductive layer 22 having first and second opposing surfaces 24 and 26, respectively. A first dielectric layer 28, which may include sublayers 29, 39, 30, 31 and 32, is positioned on the first opposing surface 24. A second dielectric layer 34, which may include sublayers 35, 41, 36, 37 and 38, is positioned on the second opposing surface 26. First dielectric layer 28 can also include first conductive layer 31, between the dielectric layers 30 and 32 for serving as power and/or ground connections. Second dielectric layer 34 can also include third conductive layer 37, between the dielectric layers 36 and 38 for serving as power and/or ground connections. The first dielectric layer 28 and the second dielectric layer 34 can further include second and fourth electrically conductive layers 39 and 41, respectively. Electrically conductive layers 39 and 41 are preferably signal carrying conductors. The second electrically conductive layer 39 is positioned between the first electrically conductive layer 31 and the thermally conductive layer 22. The fourth electrically conductive layer 41 is positioned between the third electrically conductive layer 37 and the thermally conductive layer 22. Electrically conductive layers 31, 37, 39, and 41 can be comprised of a suitable metal such as copper or aluminum, preferably copper) and can have a thickness of from about 0.20 to about 1.0 mils, preferably about 0.50 mils. An aspect of the current invention is that each of the signal carrying layers 39 and 41 is shielded on either side by an electrically conducting layer which significantly reduces signal noise. Signal carrying layer 39 is shielded by electrically conducting layers 31 and 22, while signal carrying layer 41 is shielded by electrically conducting layers 37 and 22.

As a first dielectric material embodiment of the present invention, layers 29, 30 and 32 of first dielectric layer 28, and layers 35, 36 and 38 of second dielectric layer 34 may comprise an organic polymeric material which may be filled with a particulate material. The dielectric constant of these dielectric layers is preferably from about 1.5 to about 3.5, and more preferably from about 2 to about 3. The thickness of the filled dielectric layers can vary according to the desired design performance characteristics of the multi-layered interconnect structure 18, and said thicknesses may be about equal if so dictated by design performance requirements. Significantly, the dielectric material of the dielectric layers 28 and 34 does not contain conventional woven fiberglass. Such absence of woven fiberglass enables through holes to be closely spaced. Indeed, spacing between through hole centers of less than 100 mils, preferably less than 50 mils but more preferably about 25 mils and most preferably less than 10 mils, is achievable without electrical shorting between adjacent conductive through holes. Preferably, the particulate filler has a diameter less than about 10 μm, more preferably from about 5 to about 8 μm. Preferably, the particulate filler is present from about 30 to about 70 percent by weight, more preferably from about 40 to about 60 percent by weight of the material. Preferably, the particulate filler is silica. Suitable materials for the dielectric layer include, for example, cyanate ester and polytetrafluoroethylene. A suitable silica filled polytetrafluoroethylene is available as HT 2800 from Rogers Corporation (Rogers, Conn.).

A first plurality of electrically conductive members 40 is positioned on the first dielectric layer 28 and a second plurality of electrically conductive members 42 is positioned on the second dielectric layer 34. These electrically conductive members 40 and 42 may comprise a metal such as, inter alia, copper. The first and second pluralities of electrically conductive members 40 and 42 can each have thicknesses ranging from about 0.25 to about 1.5 mils. A first plurality of solder connections 47 positioned on a first plurality of microvias 55 and in electrical contact with the first plurality of electrically conductive members 40 are electrically connected to respective ones of the plurality of contact members 16 on the semiconductor chip 12. The first plurality of microvias 55 are a first plurality of openings with internal walls formed in a third dielectric layer 46 that expose at least portions of the first plurality of electrically conductive members 40. Each of the first plurality of openings includes a layer of electrically conductive material 45 (e.g., copper), positioned on the internal walls of the first plurality of openings and on portions of selected ones of the plurality of first electrically conductive members 40. The first plurality of solder connections 47 are comprised of a low melt solder (melting temperature below about 230° C.), such as inter alia eutectic solder, comprised of a composition of about 63% lead and about 37% tin.

The thermally conductive layer 22 is comprised of a material having a selected thickness and coefficient of thermal expansion to substantially prevent failure of the first plurality of solder connections 47 between the first plurality of electrically conductive members 40 and semiconductor chip 12. Thermally conductive member (or layer) 22 can be a suitable metal comprised of nickel, copper, molybdenum, or iron. The thermally conductive layer 22 may function as a ground plane. An embodiment of thermally conductive layer 22 (which has a CTE of close to zero such as, inter alia, between about 4 ppm/° C. and about 8 ppm/° C.) is a three layered structure comprised of a first layer of copper, a second layer of an alloy of about 34% to about 38% nickel (e.g., about 36% nickel) and about 62% to about 66% iron (e.g., about 63% iron), and a third layer of copper. The overall CTE (i.e., spatially averaged CTE) of thermally conductive layer 22 is from about 4 to about 8 ppm/° C. About 72% to about 80% of the thickness of the thermally conductive layer 22 may be the nickel-iron alloy and about 20% to about 28% of the thickness of the thermally conductive layer may be copper. A suitable 36% nickel-63% iron alloy is available from Texas Instruments Incorporated (Attleboro, Mass.). Alternatively, the thermally conductive layer 22 can be formed solely of a single metal alloy such as a about 36% nickel-about 63% iron alloy. The thickness of the thermally conductive layer 22 may be from about 1 mil to about 3 mils. The thickness and choice of material for the thermally conductive layer 22 will determine the CTE of the thermally conductive layer 22 and, significantly, can be used to control the overall CTE of the multi-layered interconnect structure 18 when used in combination with the other elements defined herein. When the CTE is about 10 to about 25 ppm/° C., a significant advantage is achieved. Strain control on the first plurality of solder connections 47 of the electronic package 10 is realized and localized regions of high strain are avoided during operation of the electronic package 10 (when assembled to a circuitized substrate and in field operation). The overall strain between the semiconductor chip 12, with a CTE of about 2-3 ppm/CG, and the circuitized substrate 100, with a CTE of about 17-20 ppm/° C., is thus significantly reduced in magnitude. To prevent failure of interconnections within the multi-layered interconnect structure 18, between the multi-layered interconnect structure 18 and the semiconductor chip 12, and between the circuitized substrate 100 and the multi-layered interconnect structure 18, the difference between the overall CTE of the multi-layered interconnect structure 18 and the GTE of the semiconductor chip 12 should be between about 40% and about 70% (but preferably between about 40% and about 60%) of the difference between the CTE of the circuitized substrate 100 and the CTE of the semiconductor chip 12. For controlling the CTE of the multilayered interconnect structure 18 to prevent failure of the aforementioned interconnections, it is noted that the overall CTE of the multi-layered interconnect structure 18 depends on both the CTE and thickness of the thermally conductive layer 22. It is accordingly preferred that the CTE of the thermally conductive layer 22 be between about one third and about two thirds (depending on the thickness of the thermally conductive layer 22) of the overall CTE of the multi-layered interconnect structure 18.

With the first dielectric embodiment of the present invention, described supra, layers 29, 30, 32 of first dielectric layer 28 and layers 35, 36, and 38 of second dielectric layer 34 may comprise a filled organic polymeric material having an effective modulus from about 0.01 to about 0.50 Million pounds per square inch (Mpsi), and preferably the effective modulus is from about 0.03 to about 0.10 Mpsi. The dielectric material of layers 29, 30, 32, 35, 36, and 38 includes material which can deform in an elastic manner under stress, and if subjected to sufficient stress can deform in an elastic-plastic manner. The effective modulus is defined as a secant modulus which in turn is defined as a relation of the tensile stress to total strain of an elastic-plastic stress-strain material test stress response curve (see, for example, A. Blake, "Practical Stress Analysis in Engineering Design", Marcel Dekker: 270 Madison Ave., New York, N.Y. 10016, 1982.) It is useful to employ a dielectric material having a measured tensile secant modulus within the range of 0.01 to 0.5 Mpsi, measured at room temperature, with a strain rate between the values of 0.01/min and 0.6/min, with the test conducted at a temperature between 10 and 30° C. When the first and second dielectric layers 28 and 34, respectively, are comprised of a material with this effective modulus, the multi-layered interconnect structure is relatively compliant, and warpage during operation of the electronic package is greatly reduced. This unique combination of the reduced CTE thermally conductive layer and the compliant (during operation) dielectric layers assures the prevention of failure of the first plurality of solder connections 47 between the semiconductor chip 12 and multi-layered interconnect structure 18, and between structure multi-layered interconnect 18 and the circuitized substrate 100. As a result, semiconductor chip 12 will experience much less warpage than would occur with laminates made of typical organic materials. Multi-layered interconnect structure 18 is capable of absorbing a modest amount of internal shear strain under the die. If an encapsulant is applied between the semiconductor chip 12 and the multi-layered interconnect structure 18, the compliancy of the structure will result in significantly less stress within the encapsulant. The combination of the strain control on the first plurality of solder connections 47 and the reduced tendency for the electronic package 10 to warp both contribute to preventing failure of the first plurality of solder connections 47 between the first plurality of electrical conductive members 40 and semiconductor chip 12.

A first plated through hole 50 (i.e., a first through hole plated with a metal, preferably copper) is positioned under semiconductor chip 12 and is electrically connected to at least one electrically conductive member of the first plurality of electrically conductive members 40 and to at least one electrically conductive member of the second plurality of electrically conductive members 42. Although not explicitly shown in FIG. 1, the first plated through hole 50 is also electrically connected to at least one of the first plurality of shielded signal conductors which comprise conductive layer 39. A second plated through hole 52 (i.e., a second through hole plated with a metal such as inter alia copper) is positioned under semiconductor chip 12 and is also electrically connected to at least one electrically conductive member of the first plurality of electrically conductive members 40 and to at least one electrically conductive member of the second plurality of electrically conductive members 42. Although not explicitly shown in FIG. 1, the second plated through hole 52 is also electrically connected to at least one of the second plurality of shielded signal conductors which comprise conductive layer 41. First and second plated through holes 50 and 52, respectively, have an unplated diameter from about 1.5 to about 3.0 mils and can be formed by mechanical or laser drilling, preferably by laser drilling with a commercial YAG or excimer laser. The plated through holes 50 and 52 each include a layer of about 0.15 to about 1.0 mils of a suitable plated metal (e.g., copper) on internal walls of the through holes 50 and 52. As an embodiment. each contact site of the semiconductor chip be electrically connected to no more than one plated through hole of the multi-layered interconnect structure 18.

The third dielectric layer 46 of the multi-layered interconnect structure 18 is positioned on the first dielectric layer 28 and on at least a portion of selected ones of the first plurality of electrically conductive members 40. The third dielectric layer 46 can substantially cover (i.e., tent) the first and second plated through holes 50 and 52, respectively. The fourth dielectric layer 48 is positioned on the second dielectric layer 34 and on at least a portion of selected ones of the second plurality of electrically conductive members 42. The fourth dielectric layer 48 of the multi-layered interconnect structure 18 can substantially cover (i.e., tent) the first and second plated through holes 50 and 52, respectively. The third and fourth dielectric material and fourth dielectric material may substantially fill the plated through holes 50 and 52, respectively, as shown. Alternatively, the plated through holes 50 and 52 may be filled with a material other than the third and fourth dielectric material prior to positioning the third dielectric layer 46 and the fourth dielectric layer 48 on the first dielectric layer 28 and the second dielectric layer 34, respectively.

Dielectric material of the third dielectric layer 46 ("third dielectric material") and of the fourth dielectric layer 48 ("fourth dielectric material") can be a suitable organic polymeric material. A preferred third and fourth dielectric material is a resin comprising a modified polyphenylene ether (MPPE). Useful MPPE resins which may be used in conjunction use with the present invention are disclosed in U.S. Pat. No. 5,352,745 (Katayose et al. issued Oct. 4, 1994) ("Katayose '745"), assigned to Asahi Kasei Kogyo Kabushiki Kaisha of Tokyo, Japan, and incorporated herein by reference in its entirety. The MPPE resin is described in the Katayose '745 patent as a curable polyphenylene ether resin composition comprising a reaction product obtained by reacting a polyphenylene ether with an unsaturated carboxylic acid or an acid anhydride and at least one cyanurate. Useful MPPE resins which may be used in conjunction use with the present invention are disclosed in U.S. Pat. No. 5,218,030 (Katayose et al. issued Jun. 8, 1993) ("Katayose '030"), assigned to Asahi Kasei Kogyo Kabushiki Kaisha of Tokyo, Japan, and incorporated herein by reference in its entirety. In relation to MPPE resins, the Katayose '030 patent describes the use of poly(phenylene ether) containing pendant allyl or propargyl groups, triallylcyanurate or triallylisocyanurate, and optionally an antimony-containing flame retardant; other formulations replace the antimony flame retardant with bromine containing compounds. Useful MPPE resins which may be used in conjunction use with the present invention are disclosed in U.S. Pat. No. 6,352,782 B2 (Yeager et al. issued Mar. 5, 2002) ("Yeager '782"), assigned to General Electric Company, and incorporated herein by reference in its entirety. The modified PPE resin as described in the Yeager '782 patent is a reactively end capped poly(phenylene ether) compound cured with certain unsaturated compounds.

The MPPE material may be utilized in the form of the MPPE resin coated onto a metal foil, such as a copper foil. A commercially available modified MPPE that is suitable for the present invention is manufactured by the Asahi Chemical Company of Japan and is identified as Asahi product number PC5103, which comprises the resin coated onto a copper foil. The MPPE material is particularly suitable for the third and fourth dielectric material of the present invention, because the MPPE material retains its structural integrity, and does not crack, when subjected to Thermal Acceptance Testing, described supra.

Several factors help explain why the MPPE material is useful for the present invention. A first factor is that if the allyl group is used, then the allyl group of the MPPE can form cross links and thus add hardness and stiffness to the polyphenylene ether polymer. A second factor is that the Asahi MPPE has a CTE that material that is substantially below the CTE of other organic polymers. The lower CTE of the MPPE material improves thermal compatibility of the third layer 46 and the fourth layer 48 with the remaining multi-layered interconnect structure which may have a CTE of about 10 to about 12 ppm/° C. A mismatch between the CTE of the third and fourth dielectric materials and the lower CTE of other structural components of the electronic package 10 is considered to be a significant factor in determining whether the third and fourth dielectric materials will retain its structural integrity and resist cracking. Another beneficial characteristic that may be comprised by a MPPE material is an absence of volatile solvents capable of vaporizing while being laminated (e.g., by vacuum lamination) to the first dielectric layer 28 or the second dielectric layer 34, wherein such vaporization would cause shrinkage of the redistribution layer.

Third dielectric layer 46 includes the first plurality of microvias 55. The first plurality of microvias 55 constitute a first plurality of openings defined by internal walls formed in third dielectric layer 46, said openings exposing portions of selected ones of the first plurality of electrically conductive members 40. Each of the first plurality of openings includes a layer of electrically conductive material 45 positioned on the internal walls of the first openings and, preferably, also on the exposed portions of the first plurality of electrically conductive members 40. Generally, a microvia that includes a layer of electrically conductive material positioned on its internal walls is designated as a "plated blind via." Selected ones of the first plurality of microvias 55 (or plated blind vias 55) are electrically (i.e., conductively) coupled to respective ones of the first plurality of solder connections 47, and thus electrically coupled to the first plurality of electrically conductive members 40. One plated blind via, in addition to the first plurality of microvias 55, is within the scope of the present invention and, accordingly, at least one plated blind via (such as one of plated blind vias 55) may be conductively coupled to one of the first plurality of electrically conductive members 40. The first plurality of solder connections 47 are designed to efficiently match the pattern of contact members 16 on semiconductor chip 12. Preferably, there is a match of no more than one contact member 16 with one of the plated through holes 50 or 52 under the semiconductor chip providing a direct electrical path from each of the contact members 16 to either the signal carrying second electrical conductive layer 39 (through one of the solder connections 47, one of the first electrically conductive members 40, and plated through hole 50) or to the signal carrying fourth electrically conductive layer 41 (through one of the solder connections 47, another first electrically conductive member 40, and through plated through hole 52). Thus the third dielectric layer 46 comprises a high density interconnect layer for providing a direct electrical path from a contact member 16 to a shielded signal conductor, which provides a relatively short and efficient electrical path for signals to be transmitted from the semiconductor chip 12 through the multi-layered interconnect structure 18. Similarly, the fourth dielectric layer 48 comprises a high density interconnect layer for providing a direct electrical path from the multi-layered interconnect structure 18 to the circuitized substrate 100 through the second plurality of solder connections 20.

The fourth dielectric layer 48 includes a second plurality of microvias 54. The second plurality of microvias 54 are a second plurality of openings with internal walls formed in the fourth dielectric layer that expose portions of electrically conductive members 42. Each of the second plurality of openings 54 includes a layer of electrically conductive material positioned on the internal walls of the openings and on the exposed portions of the second plurality of electrically conductive members 42 to form a plurality of conductive bonding pads 56. The conductive material on the internal walls of the first and second pluralities of openings and on the exposed portions of the first and second pluralities of electrically conductive members 40 and 42 in the third and fourth dielectric layers is preferably plated copper. As shown in FIG. 1, the semiconductor chip 12 is conductively coupled to the first plurality of microvias 55 by the plurality of contact members 16 (e.g., C4 solder balls). Generally, any electronic device (e.g., a semiconductor chip such as the semiconductor chip 12) may be conductively coupled to a microvia of the first plurality of microvias 55. Further, one microvia (or plated blind via), in addition to the first plurality of microvias 55, in the third dielectric material 46 is within the scope of the present invention The electronic package can further include a circuitized substrate 100 having a plurality of contact pads 103 on a first surface 104, which pads are electrically connected to respective ones of second plurality of solder connections 20 (e.g., solder balls) on multi-layered interconnect structure 18. Typically, the second plurality of solder connections 20 are arranged as solder balls in a ball grid array (BGA) arrangement to efficiently allow electrical signal transmission and power distribution out of and into the electronic package. The second plurality of solder connections 20 can also be comprised of columns or other shapes to provide the appropriate stand off and appropriate strain relief between multi-layered interconnect structure 18 and circuitized substrate 100. Typically the solder balls are comprised of a low melt solder metallurgy, preferably a eutectic solder material. As shown in FIG. 1, the circuitized substrate 100 is conductively coupled to the second plurality of microvias 54 by the second plurality of solder connections 20 (e.g., BGA solder balls). Generally, any electronic device (e.g., a circuitized substrate such as the circuitized substrate 100) may be conductively coupled, by one of the second plurality of solder connections 20 on one of the conductive bonding pads 56, to a microvia of the second plurality of microvias 54. Further, one microvia (or plated blind via), in addition to the second plurality of microvias 54, in the fourth dielectric material 48 is within the scope of the present invention.

The multi-layered interconnect structure 18 has an overall CTE that prevents failure of: the first solder connections 47, the second solder connections 20, and interconnections within the multi-layered interconnect structure 18. The difference between the overall CTE of the multi-layered interconnect structure 18 and the CTE of the semiconductor chip 12 is preferably between about 40% and about 60% of the difference between the CTE of the circuitized substrate 100 and the CTE of the semiconductor chip 12. The thermally conductive layer 22 has a thickness and GTE to prevent failure of: the solder connections 47, the solder connections 20, and interconnections within the multi-layered interconnect structure 18. In particular, the thermally conductive layer 22 has a CTE that is between about one third and about two thirds of the CTE of overall CTE of the multi-layered interconnect structure 18.

Although not shown in FIG. 1, a stiffener ring for mechanically stabilizing the multi-layered interconnect structure 18 may be adhesively bonded to an outer portion of a top surface 44 of the multi-layered interconnect structure 18, such as to an outer perimeter portion. An organic chip carrier, such as the multi-layered interconnect structure 18, that is made of such compliant organic material (e.g., a material having a modulus of less than 300,000 psi) cannot be easily handled. The stiffener ring, which is rigid, enhances the structural characteristics of the chip carrier (i.e., the multi-layered interconnect structure 18) by making the chip carrier more mechanically stable and thus easier to handle.

Figure 2:
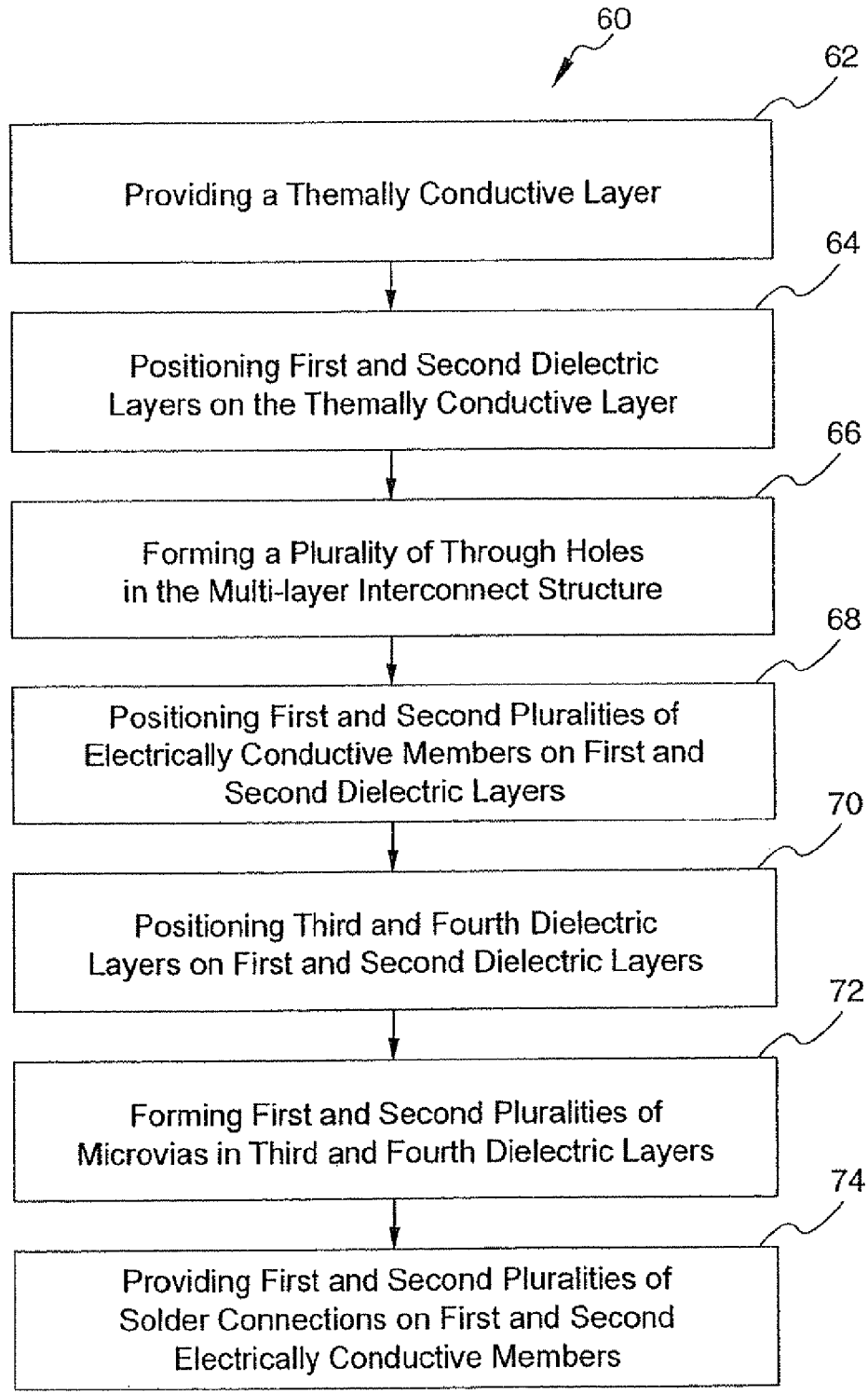
FIG. 2 is a process flow diagram showing a method for making the electronic package of FIG. 1, in accordance with preferred embodiments of the present invention.

Referring to FIG. 2, a method 60 of making the multi-layered interconnect structure 18 of FIG. 1 is shown. The resulting multi-layered interconnect structure 18, as defined herein, is adapted for electrically interconnecting the semiconductor chip 12 and the circuitized substrate 100 using solder connections. The first step 62 in this method is providing a thermally conductive layer 22 having first and second opposing surfaces 24 and 26. The multi-layer interconnect structure has been previously described supra in detail and includes a thermally conductive layer material having a selected thickness and coefficient of thermal expansion.

Next, step 64 includes positioning first and second dielectric layers 28 and 34 on the first and second opposing surfaces 24 and 26, respectively, of the thermally conductive layer 22. Step 64 is performed by laminating copper clad, silica filled PTFE layers in a laminating press at a pressure of about 1000 to about 2000 pounds per square inch (psi.) and at a temperature of about 600 to about 750 degrees Fahrenheit (° F.) to the first and second opposing surfaces of the thermally conductive layer. However, performing the aforementioned lamination of first and second dielectric layers 28 and 34 (i.e., silica filled PTFE) to the first and second opposing surfaces of the thermally conductive layer, respectively, at a lamination temperature between about 670 and about 695 degrees Fahrenheit (° F.) advantageously results in improved ductility (i.e., higher ductility) of the first and second dielectric layers 28 and 34, as is described in currently pending patent application entitled "Electronic Package With Optimized Lamination Process," (Farquhar et al.; filed Sep. 24, 2002; application Ser. No. 10/253,725; U.S. Patent Application Publication No. 2003/0020156 A1; Certificate of Mailing by Express Mail label number EK953785282US), and incorporated herein by reference in its entirety.

Step 66 includes forming the plurality of through holes 50 and 52 in the multi-layered interconnect structure 18 by laser drilling with a YAG or excimer laser. Other suitable means of drilling are possible, such as mechanical drilling. The through holes 50 and 52 formed are from about 0.5 to about 2.0 mils in diameter. The holes 50 and 52, and the internal walls of the holes cladding on the first and second dielectric layers 28 and 34 and the internal walls of the plurality of through holes 50 and 52 are then electrolessly seeded and plated with a continuous layer of a metal. The walls are plated with a thickness of metal from about 0.1 to about 1.0 mils. Suitable metals are copper and aluminum, with copper being the preferred metal.

Step 68 illustrates positioning first and second pluralities of electrically conductive members 40 and 42 on the first and second dielectric layers 28 and 34, respectively, by any method known to one of ordinary skill in the art. For example, a photoresist may be applied on the surfaces of the plated copper clad dielectric layers. The photoresist tents the plurality of plated through holes 50 and 52 to protect the plated internal walls of the plated through holes 50 and 52 from subsequent etching steps. The photoresist is then exposed and developed. A pattern of first and second pluralities of electrically conductive members 40 and 42 is then formed by etching the exposed portions of the plated metal and the copper cladding on the surface of the first and second dielectric layers 28 and 34, respectively, with a cupric etch. The photoresist is then stripped with a caustic stripper, such as sodium hydroxide, resulting in first and second pluralities of electrically conductive metal members 40 and 42 on the surfaces of the first and second dielectric layers 28 and 34, respectively. The first plurality of electrically conductive members 40 are preferably formed as substantially dog bone shaped segments. Each segment includes at least two metal pads; one end of the substantially dog bone shaped segment, the first metal pad, being connected to the metal plating on the internal walls of one of the plurality of plated through holes 50 or 52 at the surface of the first dielectric layer 28 and the other end of the substantially dogbone shaped segment being a second metal pad adapted for having a solder connection thereon and being electrically connected to the semiconductor chip 12. The first and second metal pads of each substantially dogbone-shaped segment are preferably connected by a substantially straight conductor segment. The second plurality of electrically conductive members 42 are also formed of substantially dogbone shaped segments, each segment including at least two metal pads; one end of the substantially dogbone shaped segment, the third metal pad, being connected to the metal plating on the walls of one of the plurality of plated through holes 50 or 52 at the surface of the second dielectric layer 34 and the other end of the substantially dogbone shaped segment being a fourth metal pad adapted for having a solder connection thereon for connecting to circuitized substrate 100. The solder connection can be a solder ball, solder column, or a land. Third and fourth metal pads of the substantially dogbone shaped segments are also connected by a substantially straight conductor segment. Even though substantially dogbone shaped segments may be as described herein, many other pad shapes are possible.

Figure 3:
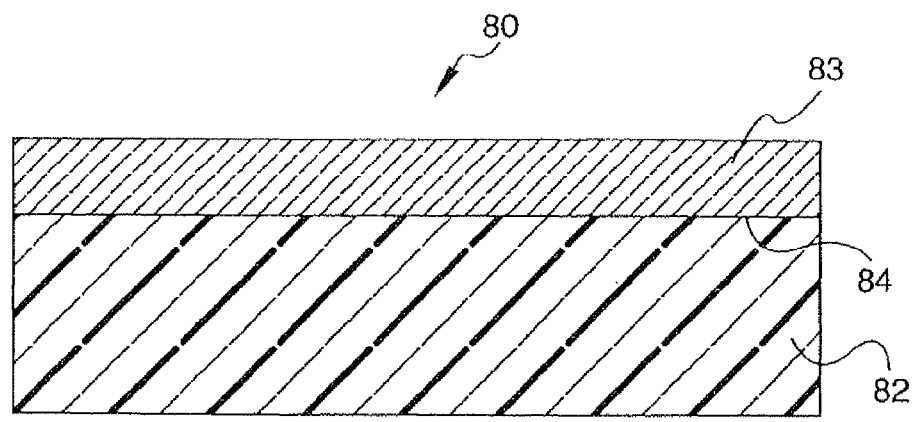
FIG. 3 depicts a front cross-sectional view of a resin coated metal comprising a dielectric resin having an modified polyphenylene ether (MPPE) on a metal foil, in accordance with preferred embodiments of the present invention.
Figure 4:
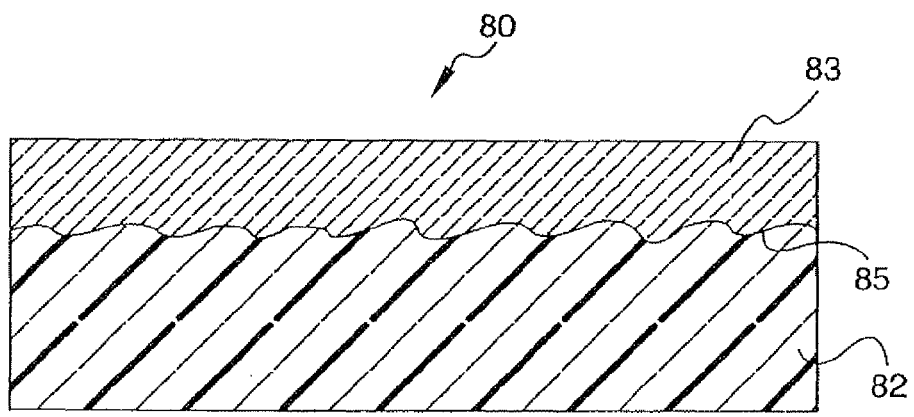
FIG. 4 depicts a FIG. 3 with zoomed view of a metal foil surface that interfaces the MPPE.
Figure 5:
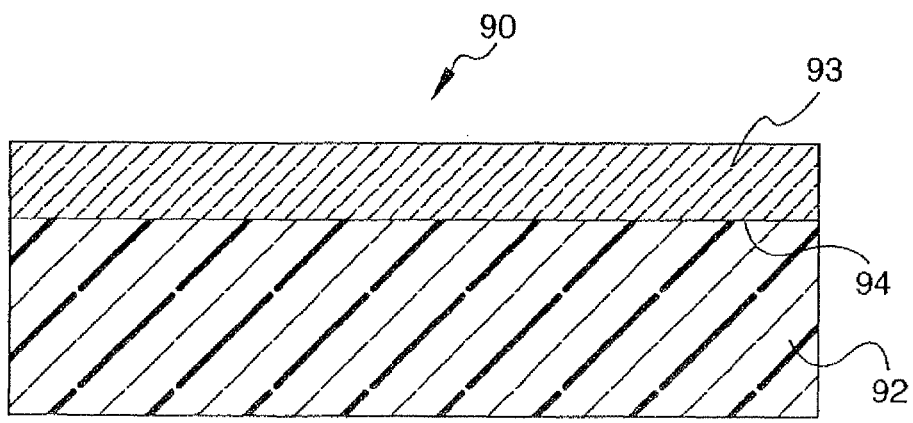
FIG. 5 depicts a front cross-sectional view of a resin coated metal comprising a dielectric resin having a MPPE on a metal foil.

Step 70 includes positioning the third dielectric layer 46 on the sublayer 32 of the first dielectric layer 28 and on the first plurality of electrically conductive members 40, and the fourth dielectric layer 48 on the sublayer 38 of the second dielectric layer 34 and on the second plurality of electrically conductive members 42. FIGS. 3-5 illustrate the dielectric material of the third and fourth dielectric layers 46 and 48, respectively, said dielectric material including the preferred dielectric resin having a modified polyphenylene ether (MPPE). FIG. 3 illustrates a front cross-sectional view of a resin coated metal 80 comprising a dielectric resin 82 having a modified polyphenylene ether (MPPE), said resin 82 adhesively coupled to a metal foil 83 (e.g., a copper foil). As an example of the resin coated metal 80, the Asahi PCS103 material mentioned supra comprises the MPPE resin coated on a copper foil. Inasmuch as the uncured resin 82 has mechanical properties that make it difficult to handle, the mechanical structure of the metal foil 83 compensates for the difficult-to-handle mechanical structure of the resin 82. The resin 82 has a thickness preferably between about 30 microns and about 70 microns. The metal foil 83 preferably has a thickness of at least about 9 microns. The metal foil 83 is rough in the sense of having peaks and valleys on the surface 84 of the metal foil 83, said surface 84 mechanically interfacing with the resin 82. FIG. 4 includes the surface 85 as a zoomed (i.e., blown up) view of the surface 84 of FIG. 3 showing the peaks and valleys. Noting that the metal foil 83 will be later removed, such as by etching, the roughness of the surface 84 (or 85) of the metal foil 83 will leave a surface impression on the resin 82 after the metal foil 83, is subsequently removed. Said surface impression is "complementary" to the metal roughness structure of the surface 84 (or 85); i.e., the resultant valleys and peaks in the resin 82 surface after the metal foil 83 is removed corresponds to the peaks and valleys, respectively, of the metal roughness structure 84 (or 85) that existed while the metal foil 83 was mechanically interfaced with the resin 82. The resin coated metal 80 will subsequently be transformed into the third dielectric layer 46 of FIG. 1.

FIG. 5 illustrates a front cross-sectional view of a resin coated metal 90 comprising a dielectric resin 92 having a modified polyphenylene ether (MPPE), said resin 92 adhesively coupled to a metal foil 93. The resin coated metal 90 has all of the characteristics that was discussed supra for the resin coated metal 80 of FIGS. 3 and 4, including a surface 94 of the metal foil 93 that is rough in the same manner that the surface 84 of the metal foil 83 is rough. The resin coated metal 90 of FIG. 5 will subsequently be transformed into the fourth dielectric layer 48 of FIG. 1.

Returning to FIG. 1, exposed surfaces of the first plurality of electrically conductive members 40, second plurality of electrically conductive members 42, the first plated through hole 50, and the second plated through hole 52 are preferably oxidized. The oxidization improves the ability of the surfaces of the first plurality of electrically conductive members 40 and of the second plurality of electrically conductive members 42 to subsequently bond with the resin 82 of FIG. 3 and the resin 92 of FIG. 5, respectively. For example, if the exposed surfaces include copper, then the oxidation may be accomplished by chloriting; i.e., by applying a solution of sodium hypochloride to said exposed surfaces. After oxidizing (or chloriting), it is preferred to vacuum bake the multilayered interconnect structure 18, at a temperature preferably between about 100° C. and about 130° C. for a time of at least about 60 minutes, to remove moisture from the laminate.

Figure 6:
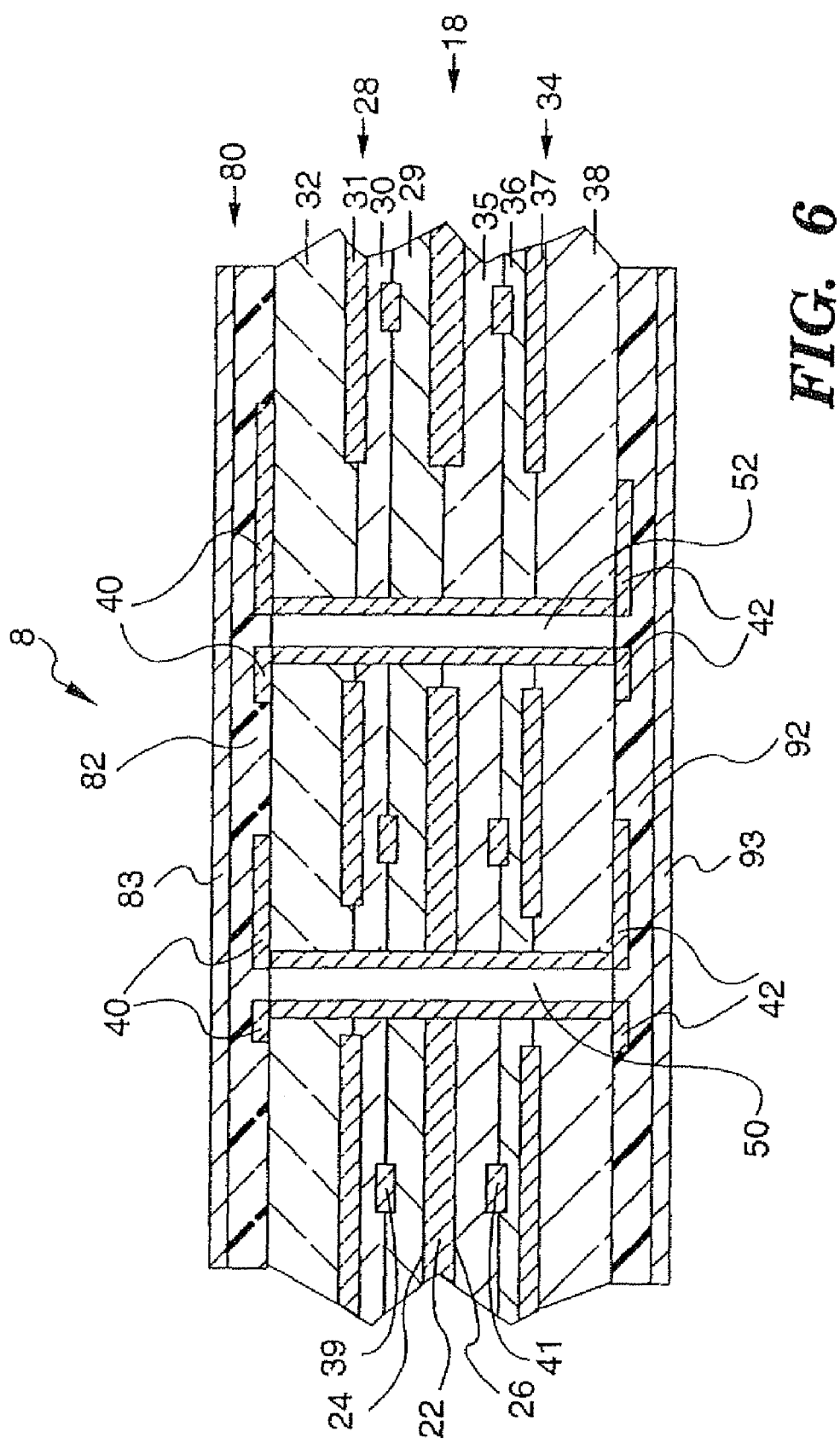
FIG. 6 depicts an electronic configuration including: the resin coated metal of FIG. 3, the resin coated metal of FIG. 5, and a portion of the multi-layered interconnect structure of FIG. 1.
Figure 7:
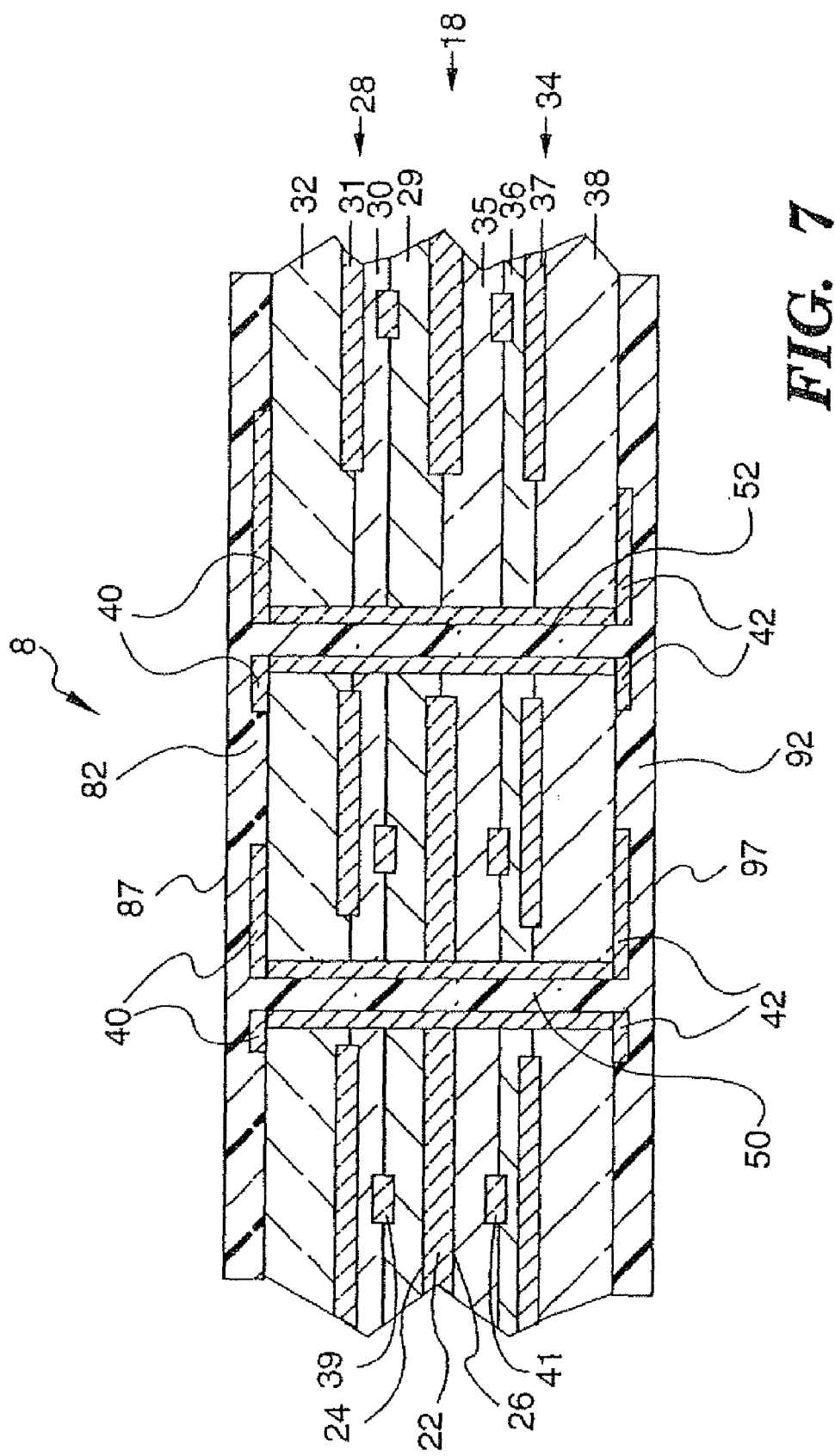
FIG. 7 depicts FIG. 6 after the electronic configuration has been pressurized and after the metal foils of the resin coated metals have removed.

For the preferred dielectric resin, Step 70 further includes (after the aforementioned oxidation): placing the resin coated metal 80 on the sublayer 32 of the first dielectric layer 28 and on the first plurality of conductive members 40 with the metal foil 83 exposed, and placing the resin coated metal 90 on the sublayer 38 of the second dielectric layer 34 and on the second plurality of electrically conductive members 42 with the metal foil 93 exposed, as shown in FIG. 6. The electronic configuration 8 of FIG. 6 includes the resin coated metal 80 of FIG. 3, the resin coated metal 90 of FIG. 5, and a portion of the multi-layered interconnect structure 10 of FIG. 1. Next, the electronic configuration 8 of FIG. 6 is pressurized in a range of about 1000 psi to about 2000 psi at an elevated temperature between about 180° C. and about 210° C. for a time of at least about 90 minutes. The pressurization and elevated temperatures causes the dielectric resins 82 and 92 to flow and become cured. The pressurization and elevated temperature adhesively laminates: the dielectric resin 82 of the resin coated metal 80 to the sublayer 32 of the first dielectric layer 28 and to the first plurality of electrically conductive members 40; and the dielectric resin 92 of the resin coated metal 90 to the sublayer 38 of the second dielectric layer 34 and to the second plurality of electrically conductive members 42. Additionally, the pressurization and elevated temperature causes the dielectric resin 82 and the dielectric resin 92 to substantially fill (i.e., completely fill aside from air pockets and/or air bubbles) the first plated through hole 50 and the second plated through hole 52, as shown in FIG. 7. After the pressurization, the metal foil 83 and the metal foil 93 are removed in a manner known to one of ordinary skill in the art, such as by etching. FIG. 7 depicts FIG. 6 after the electronic configuration 8 has been pressurized, and after the metal foils 83 and 93 have been removed. Following the pressurization and removal of the metal foils 83 and 93, the remaining dielectric resin 82 in FIG. 7 is the third dielectric layer 46 in FIG. 1, and the remaining dielectric resin 92 of FIG. 7 is the fourth dielectric layer 48 in FIG. 1. The surface 87 of the dielectric resin 82 is rough, and complementary to the rough surface 84 of the metal foil 83 of FIG. 3. The surface 97 of the dielectric resin 92 is rough, and complementary to the rough surface 94 of the metal foil 93 of FIG. 3. The roughness of the surface 97 of the dielectric resin 92 facilitates good adhesion of subsequent copper plating on the dielectric resin 92, as discussed infra in conjunction with step 72.

Step 72, denoted in FIG. 2 in relation to FIG. 1, includes forming first pluralities of microvias 55 in the third dielectric layer 46, and second pluralities of microvias 54 in the fourth dielectric layer 48, by a process of removing portions of the third dielectric layer 46 and the fourth dielectric layer 48 to form first and second pluralities of openings and exposing at least portions of selected ones of the first and second pluralities of electrically conductive members 40 and 42, respectively. The openings form internal walls of the consequent first and second pluralities of microvias 55 and 54, respectively. The first and second pluralities of microvias 55 and 54 can be formed by a process of mechanical drilling, etching, or preferably laser ablating the third and fourth dielectric layers 46 and 48, respectively. If the first and second pluralities of microvias 55 and 54 are formed by laser ablation, then the first and second pluralities of microvias microvias 55 and 54 are preferably cleaned to remove particulate matter generated by the laser ablating, employing any hole-cleaning process that is known to one of ordinary skill in the art, such as by: applying a swelling agent, treating with a potassium permanganate oxidizing material, and using an acid rinse to complete the cleaning.

The internal walls of the first and second pluralities of microvias 55 and 54 are then plated with a suitable metal, preferably copper, to form conductive layers on said openings, forming electrically conductive connections from the internal walls of the third dielectric layer 46 and fourth dielectric layer 48 to selected ones of the exposed first pluralities of electrically conductive members 40 and the exposed second pluralities of electrically conductive members 42, respectively. The plating of the internal walls may be accomplished by any method known to one of ordinary skill in the art. With copper plating, for example, a seeding material (e.g., tin palladium) may be applied to the surface 97 of the dielectric resin 92 to serve as a catalyst for electrolessly plating a thin layer (e.g., 1 to 3 microns) of copper on the surface 97, followed electroplating a thicker layer (e.g., 1 mil) of copper. The roughness of the surface 97 of the dielectric resin 92 facilitates good adhesion the copper plating on the dielectric resin 92. Copper is then selectively removed, such as by etching, from a portion of the surface 97, leaving the remaining copper plating on the internal walls and also in the form of any desired copper pads surrounding (and conductively coupled to) the copper plating on the internal walls of the first and second pluralities of microvias 55 and 54.

A solder paste is then applied to the plated first and second pluralities of microvias 55 and 54, respectively, the preferred solder paste being a low melt solder paste such as a eutectic solder paste. An examples of suitable eutectic solder paste that can be used is Alpha 3060 from Alpha Metals (Jersey City, N.J.). The microvias 55, together with the suitable metal plating on the internal walls of the microvias 55, may be denoted as a plated blind via. Similarly, the microvias 54, together with the suitable metal plating on the internal wall of the microvias 54, may also be denoted as a plated blind via.

Referring to step 74, the solder paste can then be reflowed to form part of the first and second pluralities of solder connections 47 and 20 on the first and second pluralities of electrically conductive members 40 and 42, respectively.

Next, the semiconductor chip 12 is conductively coupled to the first plurality of microvias 55 by the plurality of contact members 16 (e.g., C4 solder balls), and the circuitized substrate 100 is conductively coupled to the second plurality of microvias 54 by the second plurality of solder connections 20 (e.g., BGA solder balls). As stated supra, any electronic device (e.g., a semiconductor chip) may be conductively coupled to a microvia of the first plurality of microvias 55, and any electronic device (e.g., a circuitized substrate) may be coupled to a microvia of the second plurality of microvias 54. Also as stated supra, one microvia (or plated blind via), in addition to the first plurality of microvias 55, in the third dielectric material 46 is within the scope of the present invention, and one microvia (or plated blind via), in addition to the second plurality of microvias 54, in the fourth dielectric material 48 is within the scope of the present invention.

Referring to FIG. 1, a method of making the electronic package 10 comprises the following steps. First a semiconductor chip 12 is provided having a first surface which includes a plurality of contact members 16. The plurality of contact members 16 can be pads, columns, or balls (i.e., spheres) of high melt solder. High melt solder is defined as a solder having a melting point above about 230° C. Preferably, the plurality of contact members 16 comprises solder balls. Next, a multi-layered interconnect structure 18, as described above, is provided. The multi-layered interconnect structure 18 includes a first plurality of solder connections 47, a first plurality of plated microvias 55 including a first layer of reflowed solder paste thereon. The first layer of reflowed solder paste may be formed by applying the first solder paste to the plurality of plated microvias 55 followed by reflowing the first solder paste. A second layer of solder paste, having low melt solder paste (preferably eutectic solder paste), can be applied to the plurality of first solder connections 47 and reflowed, and the semiconductor chip's contact members 16 are each brought in contact with respective ones of the first plurality of solder connections 47 by positioning respective ones of the contact members 16 of the semiconductor chip 12 against respective ones of the first plurality of solder connections 47. This is done by positioning and aligning the semiconductor chip contact members 16 onto the reflowed solder paste. The reflowed solder paste may be shaped or contoured so as to accommodate the geometrical shape of contact members 16. For example, the reflowed solder paste may be shaped to have a flat top surface so as to accommodate contact members 16 having a spherical shape. The reflowed solder paste is then reflowed again and molten solder covers the exposed area of the plurality of microvias 55 and partially wicks up the external walls of contact members 16 of the semiconductor chip 12. Upon cooling, the molten solder solidifies and forms an electrical connection 47 between the semiconductor chip 12 and the multi-layered interconnect structure 18. The fact that the semiconductor contact members 16, have a higher melting point than the solder paste results in a solder standoff as well as an electrical connection between the semiconductor chip 16 and the multi-layered interconnect structure 18. This aides in reducing a portion of the strain between the semiconductor chip 12 and the multi-layered interconnect structure 18 during operation of the package.

The electronic package 10 of the present invention can be assembled to a circuitized substrate 100 having a plurality of contact pads 103 on one of its surfaces 104. As described, these contact pads 103 can be comprised of copper or aluminum or another suitable metal and can be coated with a layer of solder paste (not shown). The second plurality of solder connections 20 (e.g., solder balls or solder columns) of the multi-layered interconnect structure 18 are placed in contact with the solder paste on the contact pads 103 of the circuitized substrate 100. The solder paste and second solder connections 20 are reflowed and cooled forming an electrical connection between the multi-layered interconnect structure 18 and the circuitized substrate 100. The sequence of assembly of the semiconductor chip 12 to the multi-layered interconnect structure 18, followed by assembly of the multi-layered interconnect structure 18 to the circuitized substrate 100, can easily be modified. For example, the multi-layered interconnect structure 18 can be assembled to the circuitized substrate 100, followed by assembly of the semiconductor chip 12 to the multi-layered interconnect structure 18.

The electronic package 10 described herein provides signal and power distribution characteristics which complement high performance electrical demands of future semiconductor chips and is particularly suited for interconnecting high I/O (greater than 400 I/O) semiconductors. A low impedance power distribution is achieved using the solid copper power planes and high density plated through holes under the semiconductor chip, which allow multiple vertical power feeds to the semiconductor chip. Further electrical performance benefits and preservation of signal integrity (fast signal propagation, low signal capacitance and coupled noise, and matched characteristic impedance) are achieved in the electronic package by use of low dielectric constant PTFE material (Er<3), the signal carrying conductors being arranged internally in a shielded arrangement, and a direct short path length for the semiconductor chip contact members to the signal carrying conductors.

The scope of the present invention includes the electronic package 10 of FIG. 1 with removal of: the first dielectric layer 28, the second dielectric layer 34, and the thermally conductive layer 22.

While the electronic package 10 described herein includes a first plurality of electrically conductive members 40, it is within the scope of the present invention for the electronic package 10 to additionally include at least one first electrically conductive member 40.

While the electronic package 10 described herein includes a second plurality of electrically conductive members 42, it is within the scope of the present invention for the electronic package 10 to additionally include at least one second electrically conductive member 42.

While the electronic package 10 described herein includes a first plurality of microvias 55, it is within the scope of the present invention for the electronic package 10 to additionally include at least one first microvia 55.

While the electronic package 10 described herein includes a second plurality of microvias 54, it is within the scope of the present invention for the electronic package 10 to additionally include at least one second microvia 54.

While the electronic package 10 described herein includes a first plurality of solder connections 47, it is within the scope of the present invention for the electronic package 10 to additionally include at least one first solder connection 47.

While the electronic package 10 described herein includes a second plurality of solder connections 20, it is within the scope of the present invention for the electronic package 10 to additionally include at least one second solder connection 20.

While the electronic package 10 described herein includes a plurality of contact members 16, it is within the scope of the present invention for the electronic package 10 to additionally include at least one contact member 16.

While the electronic package 10 described herein includes a plurality of contact pads 103, it is within the scope of the present invention for the electronic package 10 to additionally include at least one contact pad 103.

While the electronic package 10 described herein includes a plurality of conductive bonding pads 56, it is within the scope of the present invention for the electronic package 10 to additionally include at least one conductive bonding pad 56.

While the electronic package 10 described herein includes a plurality of through holes 50 and 52, it is within the scope of the present invention for the electronic package 10 to additionally include at least one through hole 50 or 52.

Second Dielectric Material Embodiment

As a second dielectric material embodiment of the present invention, layers 29, 30 and 32 of first dielectric layer 28, and layers 35, 36 and 38 of second dielectric layer 34 alternatively comprise a liquid crystal polymer (LCP) dielectric. All aspects of the first dielectric material embodiment of the present invention, described supra, also apply to the second dielectric material embodiment except for those aspects which specifically relate to the use of LCP dielectric material as described infra in this subsection.

LCP dielectric materials have many positive attributes for forming dielectric layers, including good dielectric properties, low cost, and good mechanical properties. LCP dielectric materials have some characteristics similar to those of polyimides, such as good tear resistance and good stretching resistance, which make LCP dielectric materials suitable for processing (e.g., circuitizing, plating, etc.) in very thin layers. LCP films may offer advantages over polyimide films such as better electrical properties, better moisture resistance, better dimensional stability, and lower cost. However, to form multilayer structures with either LCP or polyimide films generally requires the use of adhesive dielectric films. The present invention discloses how to cause LCP dielectric material to adhere to a layer of material (e.g., a metal layer or a dielectric layer) without need for an extrinsic intervening adhesive layer, which reduces layer thickness, processing costs, and material costs. In addition, LCP dielectric films of this type are flame retardant without the use of halogen based additives. Multilayer composites made with these dielectrics may also be flame retardant without the use of halogens.

A commercially available LCP dielectric material that may be used in conjunction with the present invention is the BIAC thermotropic liquid crystal polymers which exhibit thermoplastic behavior and are manufactured in sheet or roll form by W.L. Gore & Associates, Inc. Information on the BIAC liquid crystal polymers may be obtained at the web site: http//www.gore.com/electronics. Another commercially available LCP dielectric material that may be used in conjunction with the present invention is the ZYVEX LCP thermotropic liquid crystal polymers which exhibit thermoplastic behavior and are manufactured in roll form by the Rogers Corporation. Generally, any LCP dielectric material is potentially usable with the present invention, depending on the material properties desired in a given application.

U.S. Pat. No. 6,274,242 (Onodera et al. 2001) ("Onodera '242"), hereby incorporated by reference in its entirety, discloses a method of making LCP films which include well known thermotropic liquid crystal polyester and thermotropic liquid crystal polyester amide. Said LCP films are prepared from four classes of compounds identified in Tables 1-4 of Onodera '242. Examples of resultant LCP structural units derived from the four classes of compounds are illustrated in Table 5 of Onodera '242. The LCP dielectrics disclosed in Onodera '242 are merely exemplary, and many other LCP dielectrics are within the scope of the present invention. Generally, any method known to one of ordinary skill in the art may be used to make the LCP dielectric material.

A LCP dielectric may exist in one of three phases: a liquid crystal phase (e.g., nematic, smectic, cholesteric), an isotropic phase, and a chemically unstable phase, which respectively correspond to three temperature domains, namely a liquid crystal temperature domain, an isotropic temperature domain, and a chemically unstable temperature domain.

In the liquid crystal phase or liquid crystal temperature domain, localized molecular regions or domains of the LCP dielectric comprise polymer chains, which are directionally ordered (i.e., anisotropically distributed) such as by processing. In the liquid crystal phase, different localized molecular domains may have different directional ordering, and many localized molecular domains may have little or no directional ordering. These polymer chains are typically less than fully rigid. Such a localized molecular domain having directional ordering may include domains of molecules and/or groups of adjacent molecules, such that the spatial extent of the localized molecular domain is of the order of a thousand or hundreds of angstroms or less. Macroscopic material properties of the LCP dielectric (e.g., coefficient of thermal expansion (CTE), dielectric constant, thermal conductivity, etc.) are sensitive to the directional order in the localized molecular regions, and material properties of LOP dielectric materials are anisotropic in accordance with the directional ordering. The macroscopic material properties of the LCP dielectric are also dependent on the shape, size, shape distribution, and size distribution of the localized molecular regions.

The LCP dielectric material is manufactured by techniques known to one of ordinary skill in the art to produce a directional ordering that provides the desired material properties in the liquid crystal phase. Such techniques may include, inter alia, two-dimensional shear imparted to the LCP dielectric material through film extrusion or through stretching in the roll direction and stretching in the direction normal to the roll direction, as the LCP dielectric material is being unrolled at a prescribed temperature and velocity. The shear may alternatively be imparted by strong polarizing electric fields.

The LCP dielectric material remains in the liquid crystal phase if its temperature is in the liquid crystal temperature range; i.e., below a temperature called the nematic-to-isotropic transition temperature ($T_{NI}$). Thus, $T_{NI}$ represents the transition from the liquid crystal phase to the isotropic phase of a LCP dielectric material. The numerical value of $T_{NI}$ depends of the specific LCP dielectric material being utilized. Additionally, the directional ordering and consequent macroscopic material properties of the LOP dielectric material are essentially invariant to changes in temperature provided that the temperature remains within the liquid crystal temperature range and does not depart from the liquid crystal temperature range. Macroscopic material properties are preserved as temperature is varied within the liquid crystal temperature domain, because there is insufficient thermal energy in the liquid crystal phase to reorient the directionality of polymer chains of the LCP dielectric material (i.e., to overcome the inter-molecular attractive forces).

The LCP dielectric material plastically deforms when subject to high pressure in the liquid crystal phase. For example, in the manufacturing of chip carriers, the high pressure may result from a combination of applied normal pressure and local geometrical irregularities such as stress concentrations resulting from surface roughness, signal lines, vias, etc. Thus if the LCP dielectric material is laminated to a layer of material (comprising dielectric, metal, etc.) at high pressure and at elevated temperature within the liquid crystal phase, then the LCP dielectric material will plastically deform and conform to the macroscopic geometry of the surface and surface features (e.g., vias) of the layer of material. This capability of the LCP dielectric material to plastically conform, under sufficient pressurization while in the liquid crystal phase during the dwell time, to the surface and surface features of an adjacent layer is an unexpected result determined through experimentation by the inventors of the present invention, and serves as a foundational basis for the present invention. With the present invention, LCP dielectric material may be laminated to an adjacent surface of a layer of material through elevation of temperature within the liquid crystal temperature domain, and under sufficient pressurization to induce plastic deformation and consequent adhesion to the adjacent surface, while preserving its macroscopic material properties. This process of plastic adhesion does not require the presence of an extrinsic adhesive layer to bond the LCP dielectric material to the adjacent layer.

Figure 8:
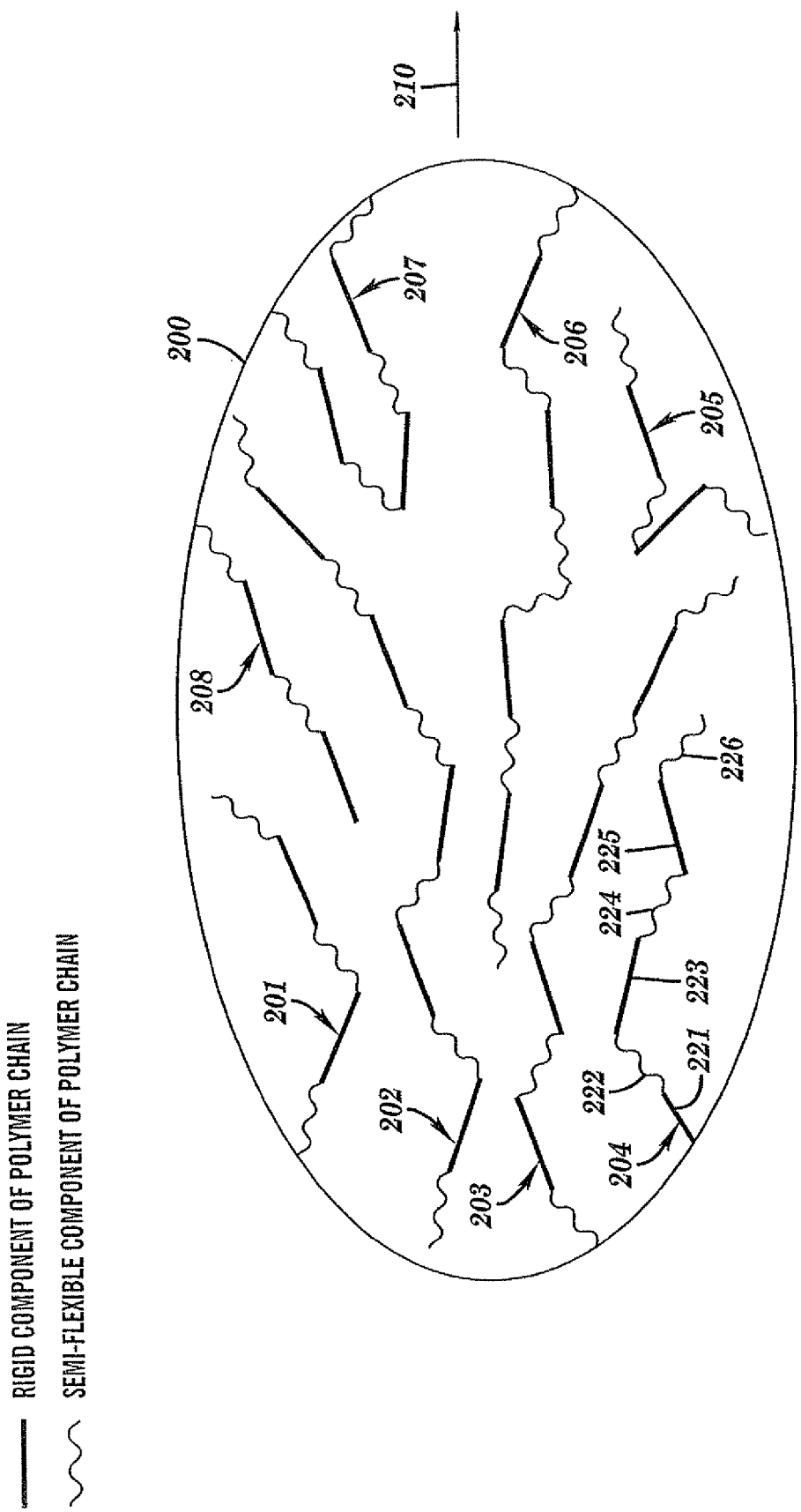
FIG. 8 depicts a localized molecular domain in the liquid crystal phase of a liquid crystal polymer (LCP) dielectric, with directional ordering of polymer chains, in accordance with embodiments of the present invention.

FIG. 8 depicts a localized molecular domain 200 in the nematic type liquid crystal phase with directional ordering of polymer chains, in accordance with embodiments of the present invention. The domain 200 includes polymer chains 201-208 ordered directionally such that the average directional orientation, angularly integrated over the directional orientations of the polymer chains 201-208, is approximately in the direction 210. Such angular integration may be performed in various ways as is known to one of ordinary skill in the art (e.g., different components of a given polymer chain may be weighted differently in the angular integration). Regardless of this specific definition used to define the angular average, however, the angular distribution of the directional orientations is clearly anisotropic such that there is a preferred direction at or near the direction 210.

In this illustration, each of polymer chains 201-208 is shown as a linear chain of alternating rigid and semi-flexible components. For example, polymer chain 205 comprises the sequence of polymer components 221-226, wherein components 221, 223, and 225 are rigid components, and wherein components 222, 224, and 226 are semi-flexible components. An example of a rigid component is a polymer having a polymer backbone that includes repeating units of substituted aromatic rings (e.g., benzene, biphenyl, naphthalene, etc.) such as disclosed in U.S. Pat. No. 6,274,242 (Onodera et al, see Tables 1, 2, 3, 4, and 5) and U.S. Pat. No. 5,900,292 (Moriya, see formulae 1, 2, 3, and 4). The rigid component may have reactive functional groups (e.g., hydroxy, amine, cyanate, carboxylic acid, and combinations thereof, etc.). An example of a semi-flexible component is a polymer having a polymer backbone that includes repeating units such as aliphatic segments (e.g., oxymethylene units, oxyethylene units, vinyl ether units, siloxanes units, etc.). The semi-flexible component may have chemically functional groups (e.g., hydroxy, amine, cyanate, carboxylic acid, and combinations thereof, etc.). Such a polymer may be prepared in two ways. First, the ends of adjacent rigid and semi-flexible components may be chemically coupled to each other to form esters, ethers, amides, etc. links in the polymer chain. Second, the ends of adjacent rigid components may be chemically coupled to each other to form ester, ether, amides (etc.) links in the polymer chain. In this second case, the links or connecting segments (esters, ethers, amides, etc.) would be the only semi-flexible component.

While FIG. 8 shows polymer chains 201-208 as each being a linear chain of alternating rigid and semi-flexible components, any linear chain of rigid and semi-flexible components (e.g., a non-alternating sequence of rigid and semi-flexible components) is within the scope of a localized molecular domain. While FIG. 8, shows polymer chains 201-208 as each being a linear chain of components, any polymer chain topography is within the scope of a localized molecular domain. For example, a localized molecular domain may also or alternatively include a chain structure that comprises one or more side chains linked to a linear chain. While FIG. 8, shows a two-dimensional representation of linear chains, the localized molecular domain generally has chain structures, which are oriented in three-dimensional space. For example, portions of any of the polymer chains 201-208 may extend above or below the depicted plane shown in FIG. 8. Accordingly, FIG. 8 may be viewed as a projection of a three-dimensional localized molecular domain onto a two-dimensional surface and the chains pictured may continue above and below the depicted plane.

In the isotropic phase or isotropic temperature domain, which exists at temperatures at or above the nematic-to-isotropic transition temperature ($T_{NI}$), there is sufficient available thermal energy to permit molecular diffusion and motion to change the directional ordering within the LCP dielectric.

Thus as temperature changes from below $T_{NI}$ to above $T_{NI}$, there is a loss of directional order and the directional orientations become more random. As a consequence, macroscopic material properties will generally change in the temperature transition from below $T_{NI}$ to above $T_{NI}$, since the macroscopic material properties are sensitive to direction orientations of polymer chains in the LCP dielectric material, as described supra. When lamination of LCP dielectric material to a layer of material is performed at a temperature in the isotropic temperature range, the LCP dielectric material softens and liquefies and thus flows into the macroscopic geometry of the surface and surface features of the layer of material. Upon subsequent cooling its thermal history and processed-in directional order is changed. In contrast, when lamination of LCP dielectric material to a layer of material is performed at a temperature in the liquid crystal temperature range with sufficient pressurization, the LCP dielectric material does not flow but rather plastically deforms into the macroscopic geometry of the surface and surface features of the layer of material, as explained supra. The present invention teaches lamination of LCP dielectric material to a layer of material only at a temperature in the liquid crystal temperature range and thus teaches an invention that preserves macroscopic material properties during the laminating process. The lower temperature in the liquid crystal temperature range prevents any risk of the material melting or of domain re-orientation of large regions. An additional advantage is that no extrinsic adhesive layer is needed to bond the LCP dielectric material to the layer of material.

Figure 9:
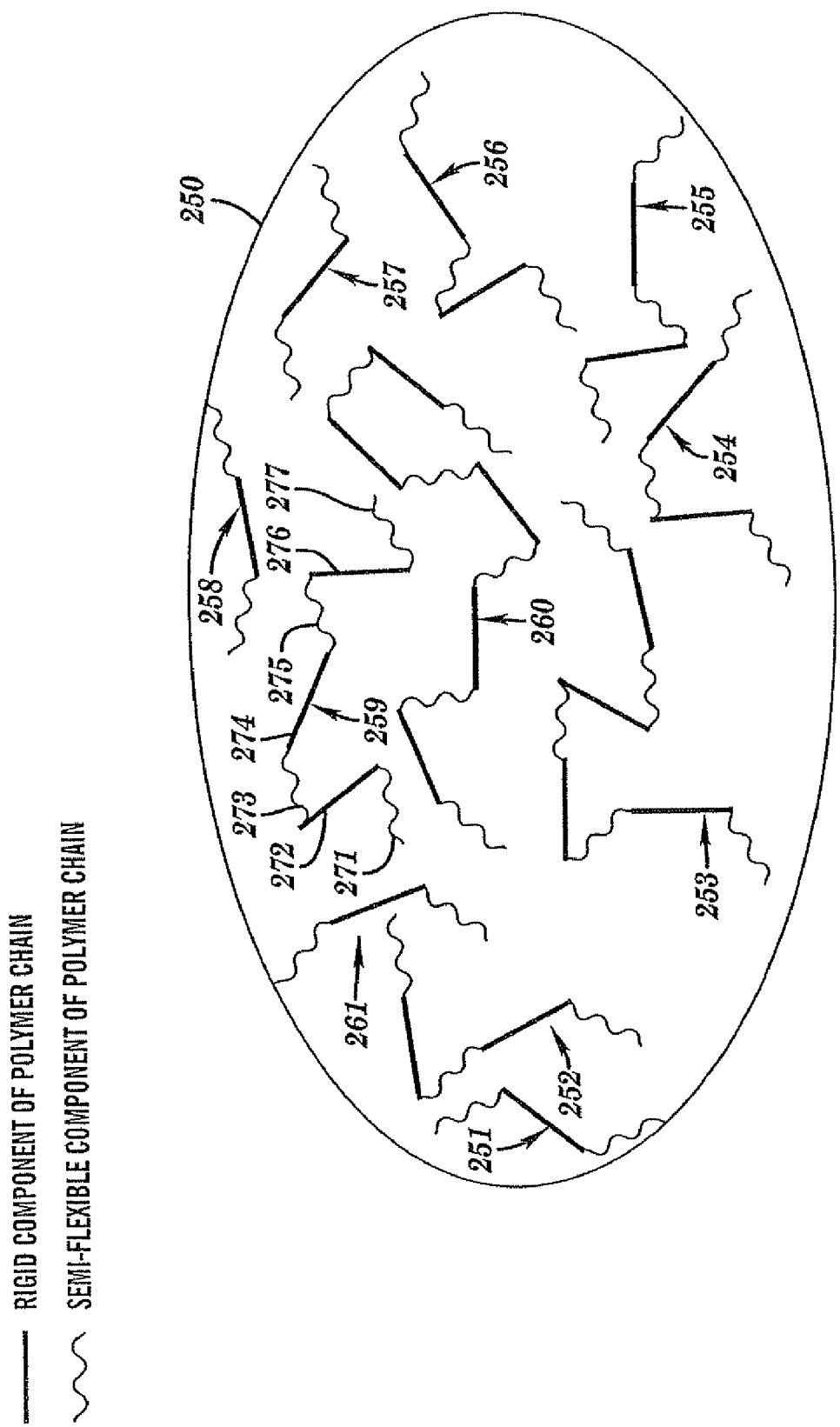
FIG. 9 depicts a localized molecular domain in the isotropic phase of a LCP dielectric, with little or no directional ordering of polymer chains, in accordance with embodiments of the present invention.

FIG. 9 depicts a localized molecular domain 250 in the isotropic phase in which there is little or no directional ordering of polymer chains, in accordance with embodiments of the present invention. The domain 250 includes polymer chains 251-261 ordered directionally such that the average directional orientation, angularly integrated over the directional orientations of the polymer chains 201-208, is approximately "zero"; i.e., there is essentially no preferred angular orientation or direction associated with the domain 250.

Each of polymer chains 251-261 is shown as a linear chain of alternating rigid and semi-flexible components. For example polymer chain 259 comprises the sequence of polymer components 271-277, wherein components 271, 273, 275, and 277 are semi-flexible components, and wherein components 272, 274, and 276 are rigid components. The rigid and semi-flexible components in the polymer chains of FIG. 9 are respectively analogous to the rigid and semi-flexible components in the polymer chains of FIG. 8, and the examples of rigid and semi-flexible polymer components discussed supra in conjunction with FIG. 8 likewise apply to the rigid and semi-flexible components of FIG. 9.

While FIG. 9 shows polymer chains 251-261 as each being a linear chain of alternating rigid and semi-flexible components, any linear chain of rigid and semi-flexible components (e.g., a non-alternating sequence of rigid and semi-flexible components) is within the scope of a localized molecular domain. While FIG. 9, shows polymer chains 251-261 as each being a linear chain of components, any polymer chain topography is within the scope of a localized molecular domain. For example, a localized molecular domain may also or alternatively include a chain structure that comprises one or more side chains linked to a linear chain. While FIG. 9, shows a two-dimensional representation of linear chains, the localized molecular domain generally has chain structures which are oriented in three-dimensional space. For example, portions of any of the polymer chains 251-261 may extend above or below the depicted plane shown in FIG. 9. Accordingly, FIG. 9 may be viewed as a projection of a three-dimensional localized molecular domain onto a two-dimensional surface and the chains pictured may continue above and below the depicted.

In the chemically unstable phase or chemically unstable temperature domain, which occurs at significantly higher temperatures than the nematic-to-isotropic transition temperature ($T_{NI}$), there is sufficient available thermal energy to cause chemical decomposition within the LCP dielectric. The chemically unstable phase is not relevant to the present invention.

The present invention discloses a method for bonding LCP dielectric material to a layer of material (e.g., a dielectric layer or a metal layer or a combination thereof). As background for the present invention, the following discussion describes tests performed by the inventors of the present invention. In tests dating to 1994, the present inventors have attempted melt processing of LCPs, as known and taught in the art, to build multi-layer structures, with the approach of using precise temperature control to laminate the materials at temperatures just above or just below the "melting" temperature (i.e., $T_{NI}$) as determined by differential scanning calorimetry and by parallel plate rheometry. These experiments are characterized by inconsistent results in adhesion, laminate thickness, edge squeeze out, and importantly the physical properties of resulting laminate. Of particular note are the inconsistent changes that occurred in the coefficient of thermal expansion. This is a clear indication that the properties of the base laminate have been changed, essentially destroying their utility for the use intended, and therefore requiring the use of adhesive layers to form multi-layer circuits.

In contrast, experiments performed during June through September of 2002 have shown that by lowering the temperature to below $T_{NI}$, consistent adhesion is achieved without altering the properties of the base laminate. For example, Gore BIAC material, having a 2 mil thickness with 15 um of copper cladding on each side, was utilized. Etching away the copper, the inventors determined that the coefficient of thermal expansion (CTE) was approximately 20 to 25 ppm/° C. as received from the vendor. A thermal mechanical analyser was used to determine the CTE in various locations on a panel that measured approximately 13×18 inches. The CTE was measured in both x-coordinate and y-coordinate directions (i.e., in the two directions that are perpendicular to the thickness direction of the BIAC layer and also perpendicular to each other). Both a film-fiber configuration and a more conventional contacting probe were used to make these measurements.

After characterizing the properties of individual plies of the LCP, multi-ply laminates were prepared. The laminates comprised 4 ply and 6 ply thick composites formed using the Gore BIAC material, from which the copper cladding had been etched away. The parts were subjected to a lamination process that involved heating to 560° F. at a heatup rate of 15° F. per minute, next followed by a dwell time of approximately 20 to 30 minutes, and then followed by cooling at approximately 20° F. per minute to room temperature. Dwell time is defined herein, including in the claims, as a time interval during which the part being laminated is subjected to the highest temperature (within a reasonable temperature tolerance of said highest temperature due to statistical scatter and other minor variations) that the part experiences during the entire lamination process, said entire lamination process including all processing steps. Note that the maximum temperature of 560° F. is less that the liquid crystal transition temperature (assumed herein to be essentially the same as $T_{NI}$) of 635° F. of the Gore BIAC material. The lamination was accomplished using a flat bed press with electrically heated steel platens.

The pressure was maintained at 2500 psi throughout the processing. Stainless steel planishing plates and copper release sheets were employed, as well as interleaving layers of polytetrafluoroethylene (PTFE) and copper to make a press pad above and below the tooling. Upon removal from the press, the inventors found no evidence of dielectric squeeze out at the edges of the laminate.

The thermal mechanical analysis was repeated and determined that the x-coordinate and y-coordinate (in-plane) CTE were unaltered by the lamination process. Adhesion tests were performed, using a 180 degree pull at 1 inch per minute, and an inner layer adhesion strength in excess of 6 lbf/inch was determined.

The same lamination process was repeated to evaluate the extent to which topography associated with realistic circuit features could be accommodated. A layer of Roger 2800 dielectric (PTFE/SiO2 filler) was used, and the layer of Roger 2800 dielectric had surface features including 12 um thick Cu formed into the circuit line of 30 to 50 um in width. The layer of the Gore BIAC LCP (50 um thick) was positioned above the Roger 2800 dielectric surface and the lamination was performed at the previously described conditions. Upon removal and subsequent cross sectioning, it was found that the circuit features were completely encapsulated. As before, there was no edge squeeze out. Adhesion testing showed an inner layer adhesion strength in excess of 4 lbf/inch between the LCP and Roger 2800 dielectric.

In another experiment, standard photolithography techniques were applied to copper clad LCP (i.e., 15 um copper cladded to Gore BIAC LCP) to form a pattern of clearance holes ranging from 50 to 500 um diameter on one of the copper surfaces. A second sheet of Gore BIAC LCP (with copper removed) was placed against the side of the first sheet that had the clearance holes. After repeating the lamination process as described supra, the part was cross-sectioned and it was determined that the holes were completely filled with BIAC LCP dielectric material. Again there was no evidence of edge squeeze out, and the adhesion was consistent across the panel.

The lamination experiments were first performed in panel sizes as small as 4"×4" in an electrically heated 75 ton laboratory press with no vacuum enclosure, manufactured by PHI Corporation. The results were duplicated in an electrically heated 125 ton Wabash press with a vacuum enclosure, and finally in a 600 ton electrically heated TMP press in 13"×18" format. These larger samples were used to establish the uniformity of adhesion, hole fill, and physical properties over a panel size that would be practical in manufacturing.

Based on the preceding experiments and supplementary analysis, which are consistent with the model (described supra) of directional ordering characteristics of LCP dielectric materials as being differentiated in the liquid crystal and isotropic phases, the basic technique of the present invention for laminating a LCP dielectric material to a layer of material (e.g., a dielectric layer or a metal layer or a combination thereof) is to perform the lamination at a temperature T wholly in the liquid crystal temperature range (i.e., $T<T_{NI}$) with no excursion into the isotropic temperature range, under sufficient pressurization and for a sufficient time to cause the LCP dielectric material to be effectively laminated to the layer of material, For the Gore BIAC LCP material, $T_{NI}$ is about 635° F. For the Gore BIA LCP material, the maximum lamination temperature should be less than 635° F.; however, due to temperature uncertainties and spatial variation, a maximum processing temperature for lamination may be about 620° F., and representative lamination temperature ranges include, inter alia, 540° F. to 620° F. and 545° F. to 580° F. For the Rogers ZYVEC LCP material, $T_{NI}$ is about 536° F. For the Rogers ZYVEC LCP material the maximum lamination temperature should be less than 536° F.; however, due to temperature uncertainties and spatial variation, a maximum processing temperature for lamination may be about 520° F., and representative lamination temperature ranges include, inter alia, 440° F. to 520° F. and 465° F. to 590° F.

Although the preceding experiments were performed at a pressure of 2500 psi, the present inventors have used pressure in the range of 1000 to 3000 psi and achieved good adhesion. It was found that an improvement in uniformity correlated with increasing pressure. The effectiveness of the pressure depends on the aspect ratio of the features that must be filled during the lamination. The testing performed by the inventors thus far indicate that a range in pressure of 2000 to 2500 psi is particularly effective, as well as practical and economical for use in a conventional manufacturing environment. Extreme pressures can have the drawback of shortened life for the tooling and platens, and also require increased capacity for the press itself.

The dwell times used by the present inventors include keeping the material LCP dielectric pressurized at maximum temperature for durations as short as 2 to 5 minutes to durations as long as 60 minutes. It was found that no undesirable "edge squeeze out" or other evidence of excess flow occurs with the longer times, although some improvement in adhesion uniformity may result. Thus the maximum dwell time for temperature and pressure should generally be at least 2 minutes, and applicable ranges of dwell times include, inter alia, 2 to 60 minutes and 15 to 30 minutes. A minimum dwell is required to ensure temperature uniformity. However, the quality of the filling of features should improve with increasing dwell time. On the other hand, shorter times are favorable for economy of manufacturing, and the shorter dwell times reflect this goal of economy. Nonetheless, no upper limit of dwell time has been observed by virtue of the resulting properties of the laminates.

Repeating the lamination cycle twice may improve the uniformity of adhesion, and by repositioning the product in the lamination press (perhaps turning it 180 degrees), the low spots become high spots, resulting in more uniform adhesion, especially along the edges.

In accordance with the discussion of LCP dielectric materials and the testing relating to lamination of LCP dielectric materials to a layer of material, the LCP material used in the present invention may be a partially ordered liquid crystal polymer resulting from various processing steps which partially orient the microscopic liquid crystal domains directionally during the manufacturing of the LCP dielectric. Higher order smectic (i.e., orientational and positional order) phases may also be present. Although the preceding discussion focused on homogenous LCP dielectrics, the adhesiveless lamination process of the present invention is also applicable to LCP materials that contain fillers, such as ceramic or organic, particulate or fiber-like, or even metallic particles. Further, expanded PTFE as a reinforcement in LCP materials in within the scope of the present invention.

The desired material properties for the LCP dielectric material, in the context of the present invention, are application dependent. For the multi-layered interconnect structure described supra in conjunction with FIGS. 1-7, as well as for other applications, material properties may comprise: in-plane CTE (i.e., CTE in direction perpendicular to the thickness direction of a LCP dielectric layer) of about 10 to 25 ppm/C; dielectric constant of about 2.5 to 3.0; Young's modulus of about 3 to 6 GPa; dissipation factor of less than about 0.003; and moisture absorption of less than about 0.2% for 96 hours at 121° C. and 2 atm. The thickness of the LCP dielectric layers can vary according to the desired design performance characteristics of the multi-layered interconnect structure (e.g., the multi-layered interconnect structure 18 of FIG. 1), and said thicknesses may be about equal if so dictated by design performance requirements. For manufacturing efficiency, lamination is typically performed with a "book" that includes multiple pages.

Figure 11:
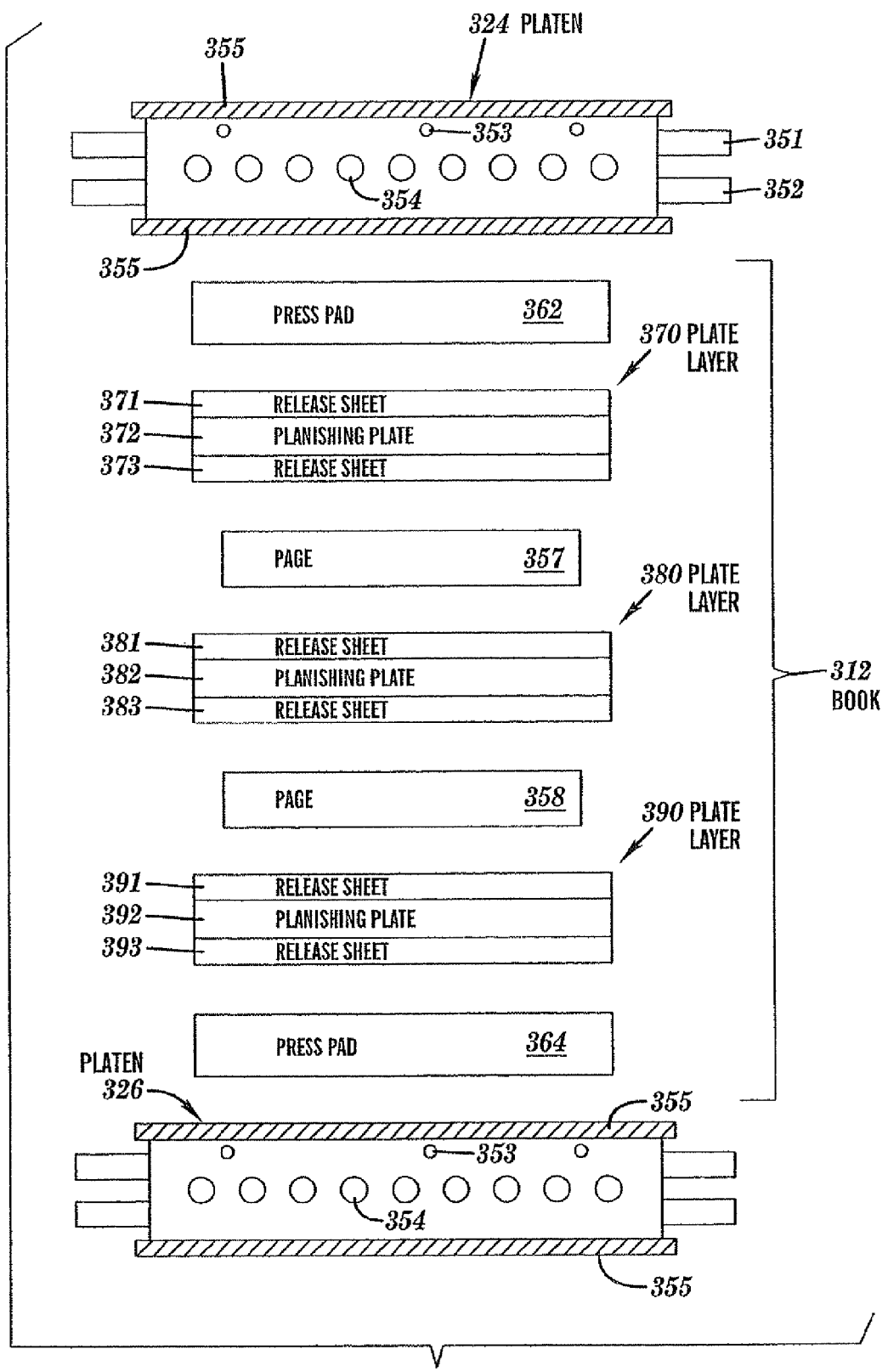
Figure 12:
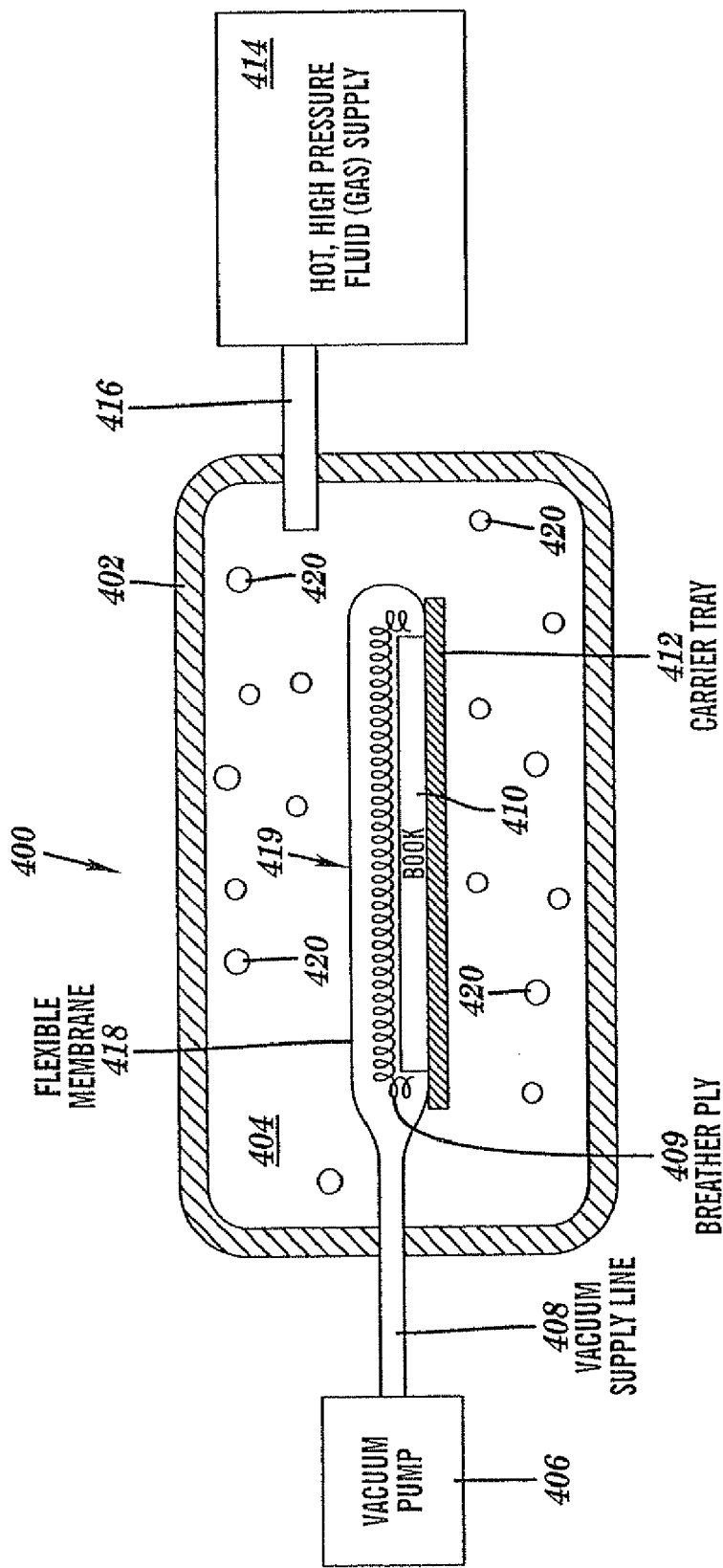
FIG. 12 illustrates an autoclave lamination press for lamination of stacked layers that include LCP dielectric material, in accordance with embodiments of the present invention.

The following discussion discloses two practical methods of performing lamination of a multi-layered interconnect structure (called a "page"), namely flat-bed press lamination (see FIGS. 10-11) and autoclave lamination (see FIG. 12).

Figure 10:
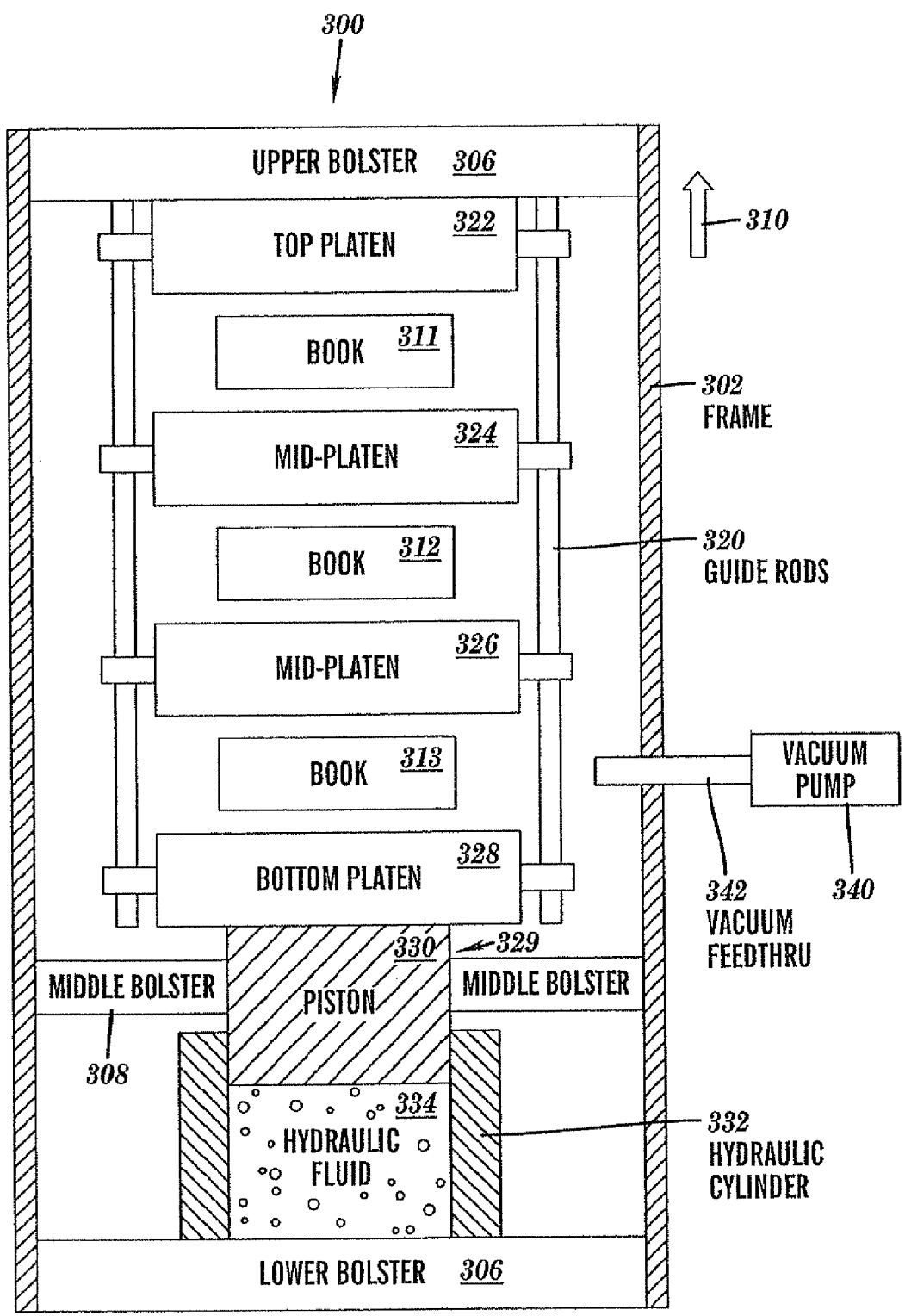
FIGS. 10 and 11 illustrate flat-bed press lamination for lamination of stacked layers that include LCP dielectric material, in accordance with embodiments of the present invention.

FIGS. 10 and 11 illustrate flat-bed press lamination for lamination of stacked layers that include LCP dielectric material, in accordance with embodiments of the present invention. In FIG. 10, a flat-bed lamination press 300 is enclosed and structurally supported by a frame 302. FIG. 10 depicts a three-opening flat-bed lamination press 300 that has an upper bolster 304, a middle bolster 308, a lower bolster 306, a top platen 322, mid-platens 324 and 326, a bottom platen 328, books 311-313, guide rods 320, a hydraulic system 329, a vacuum pump 340, and a vacuum feedthru 342. The platens 322, 324, 326, and 328 and books 311-313 may be supported from below by the middle bolster 308 and are constrained from above by the upper bolster 304. The platens 322, 324, 326, and 328 are supported laterally and guided vertically by the guide rods 320. The hydraulic system 329 comprises a hydraulic cylinder 322, hydraulic fluid 334, a piston 330, and a pump (not shown) that circulates the hydraulic fluid 334 by use of a supply line (not shown) that is coupled to the pump. The hydraulic cylinder 334 is used to apply pressure to the platens. Typical operating pressures for the hydraulic fluid 334 are in a range of up to 5000 psi. The pressure applied to the books depends on the relative size of the book versus the diameter of the hydraulic piston 330. With the present invention, pressures in a range of inter alia, about 1000 to about 3000 psi may be applied to the product layers within the books. The chamber of the press may be subject to a vacuum generated by the vacuum pump 340 with the vacuum feedthru 342, so as to minimize oxidation and entrapment of voids during lamination processing. Alternatively, the vacuum pump 340 may be omitted, or turned off and not used during lamination press operation. Not shown are the feedthroughs and supply lines for the platen heating and cooling systems, which could be electrically or fluid heated, and fluid cooled.

Book 311 is disposed between top platen 322 and mid-platen 324. Book 312 is disposed between mid-platen 324 and mid-platen 326. Book 313 is disposed between mid-platen 326 and bottom platen 328. While FIG. 10 shows three books 311-313, the flat-bed lamination press 300 may process at least one of such books and as many books as can fit geometrically between the upper bolster 304 and the middle bolster 308, in consideration of the thickness in the direction 310 of the platens and the books. Each of books 311-313 comprises one or more pages, and each page comprises multiple layers and/or multilayered structures to be laminated together by pressurization through movement of the piston 330 in the direction 310 such that each book is compressed between the platens that contact the book on each side of the book (e.g., the book 312 is compressed between the platens 324 and 326). The multiple layers and/or multilayered structures of each page comprise one or more LCP dielectric layers. Upon actuation of the press, the piston 330 moves up in the direction 310 and platens 322, 324, 326, 328 and come into contact with books 311-313. The platens that contact the books during the lamination process not only provide surfaces for compressing the books during lamination, but also provide a heat source for elevating the temperature of the LCP dielectric layers in each page of each book as will be explained infra. An example of a multilayered laminate that results from use of the flat-bed lamination press 300 is the multi-layered interconnect structure 18 of FIG. 1 such that each of dielectric layers 29, 30, 32, 35, 36 and 38 comprise LCP dielectric material.

FIG. 11 shows the detailed structure of book 312 and platens 324 and 326 of FIG. 10, in accordance with embodiments of the present invention. The book 312 comprises an alternating sequence of plate layers and pages between press pads 362 and 364. In particular, the book 312, comprises the alternating sequence of: plate layer 370, page 357, plate layer 380, page 358, and plate layer 390. The plate layer 370 comprises a planishing plate 372 sandwiched between release sheets 371 and 373. The planishing plate 372 assists in planarizing the page 357. Various considerations are made in selecting the material of the planishing plate 372, including its thickness, size, and thermal expansion characteristics. In many applications, the planishing plate 372 may comprise stainless steel. The release sheets 371 and 373 should comprise a material (e.g., copper) that enables the plate layer to be easily detached from the page 357 after completion of the lamination processing. The plate layer 380 comprises a planishing plate 382 sandwiched between release sheets 381 and 383, and the planishing plate 382 and release sheets 381 and 383 are respectively analogous to the planishing plate 372 and release sheets 371 and 373. The plate layer 390 comprises a planishing plate 392 sandwiched between release sheets 391 and 393, and the planishing plate 392 and release sheets 391 and 393 are respectively analogous to the planishing plate 372 and release sheets 371 and 373. The press pads 362 and 364 may include a compliant material to give more uniform lamination by compensating for spatial thickness non-uniformities in the pages and release sheets.

Platens 324 and 326 are similarly constructed. In platen 324, heating elements 354 may generate heat in any form that is known to one of ordinary skill in the art such as generation of heat by electrical resistance heaters or by a heated circulating fluid (e.g., oil). Inlet tube 351 and outlet tube 352 are use to circulate fluid (e.g., air, water, etc.) through the platen 324 for cooling purposes. Platen 324 also includes thermocouple ports 353 for using thermocouples to measure platen 324 temperatures. Platen 324 is bounded by wear plates 355 for planarizing the book 312 as the book 312 is pressurized. The wear plates 355 are thermally conductive and transmit heat generated by the heating elements 354 to the book 312. The wear plates 355 should have good thermal conductivity and may comprise hardened steel in some applications.

FIG. 12 illustrates an autoclave lamination press for lamination of stacked layers that include LCP dielectric material, in accordance with embodiments of the present invention. In FIG. 12, an autoclave 400 comprises a chamber 404 surrounded by an enclosure 402. The chamber 404 comprises a vacuum bag 419 enclosed by flexible membrane 418. A book 410 is placed within the vacuum bag 419. The vacuum bag 419 can have various configurations, but it must completely envelope the book 410, and provide some flexibility so that the vacuum bag 419 will conform to the book 410 upon evacuation (described infra). The vacuum bag 419 and the book 410 therewithin are placed in the chamber 404 which is then sealed. The vacuum bag 419 may also include a breather ply 409 for the purpose of facilitating complete evacuation of the vacuum bag 419. The vacuum bag 419 with the included book 410 is mechanically supported by a carrier tray 412. The flexible membrane 418 provides a pressure boundary that interfaces with a pressurized, heated gas 420 (e.g., nitrogen) within the portion of the chamber 404 that is exterior to the flexible membrane 418. The pressure differential between the space exterior to the flexible membrane 418 and the space within the vacuum bag 419 may be further controlled by evacuating the air from within the vacuum bag 419 by a vacuum pump 406 via a vacuum supply line 408. The pressurized, heated gas 420 is supplied to the chamber 404 by a source 414 through gas inlet tubing 416. Thus the gas 420 is a medium through which elevated temperature and pressure are applied to book 410 so as to laminate the pages contained within the book 410. The resulting laminations are similar to that achieved in a flat bed lamination press, in that compressive stresses normal to the book 410 are achieved. However, the pressure uniformity is generally improved by the use of the autoclave 400, since there is an absence of shear tractions on the outer surface of the book 410. Although FIG. 12 shows one vacuum bag 419, the scope of the present invention also includes a plurality of such vacuum bags within the chamber 404.

For both the flat bed lamination press and the autoclave lamination press, the temperatures, pressures, and dwell times are in accordance with the need to laminate one or more layers of LCP dielectric material to other layers of material, as discussed infra. Thus during the lamination process, the LCP dielectric material should be laminated at a temperature T wholly in the liquid crystal temperature range (i.e., $T<T_{NI}$) with no excursion into the isotropic temperature range, under sufficient pressurization and for a sufficient dwell time to cause the LCP dielectric material to be effectively laminated to the layer of material. For many applications, pressure in the range of 1000 to 3000 psi will effectuate good adhesion. The dwell time for maximum temperature and pressure should generally be at least 2 minutes, and applicable ranges of dwell times include, inter alia, 2 to 60 minutes and 15 to 30 minutes.

It is known in the art that for lamination of conventional thermoset dielectric layers (e.g. epoxy/glass pre-preg), comparable results (e.g., with respect to adhesion and flow) can be obtained at reduced pressure in an autoclave versus a flat bed press. This suggests that in the case of LCP lamination, reduced pressures (perhaps by as much as a factor of two) may be effective, and thus desirable for reducing costs associated with autoclave lamination.

In addition to use of the flat bed lamination press and the autoclave lamination press for laminating stacked LCP dielectric layers to other layers, other lamination press hardware known to one of ordinary skill in the art may be used for accomplishing such laminations in accordance with the aforementioned conditions on temperature, pressure, and dwell time.

The lamination process can be used to stack layers of LCP dielectric material with layers of dielectric material (i.e., either LCP dielectric or non-LCP dielectric) or metallic layers, (e.g., signal planes, power planes, ground planes, etc,), and signals thereof. With such stacking, attention should be given to achieving correct layer to layer alignment. Each copper clad dielectric core can have reference (fiducial) holes that are used for mechanical pins to provide layer to layer alignment. Both the photolithography steps to form circuit features and the lamination process can utilize these reference holes. Special tooling that includes plates with corresponding holes that accommodate the pins are used. The reference holes in the dielectric cores can be formed prior to and used as a reference for the photolithography steps, or alternately, they can be formed after the photolithography steps and then drilled in reference to the circuit features. This technique allows for calculation of the optimal location for the pin holes, given that some distortion or size change of the core may have occurred during the photolithography (especially for thin layers). A further alternative is to use a means of optical alignment, where the circuit features on the cores are detected, and then the layers are positioned and held in place for the lamination process, without using any pins.

The method described supra in conjunction with FIG. 2 for forming the multi-layered interconnect structure 18 of FIG. 1 in accordance with the first dielectric material embodiment is modified as follows for implementing the second dielectric material embodiment in which layers 29, 30 and 32 of first dielectric layer 28, and layers 35, 36 and 38 of second dielectric layer 34, comprise a LCP dielectric. Note that the first dielectric layer 28 may comprise a first LCP dielectric material, and the second dielectric layer 34 comprise a second LCP dielectric material. The first LCP dielectric material and the second LCP dielectric material may be a same LCP dielectric material. Alternatively, the first LCP dielectric material and the second LCP dielectric material may be a different LCP dielectric material.

Step 62 of FIG. 2 is to be performed as described supra in conjunction with the first dielectric material embodiment.

Step 64 of FIG. 2 is to be modified such that the pressurization and temperature elevation described supra in conjunction with the first dielectric material embodiment is to be replaced by the pressurization and temperature elevation described supra in conjunction with the second dielectric material embodiment for laminating LCP dielectric material to other layers of material. In particular, the lamination temperature T is to be wholly in the liquid crystal temperature range (i.e., $T<T_{NI}$) with no excursion into the isotropic temperature range, under sufficient pressurization (e.g., 1000 to 3000 psi) and for a sufficient dwell time to cause the LCP dielectric material to be effectively laminated to the layer of material. The dwell time for maximum temperature and pressure should generally be at least 2 minutes, and applicable ranges of dwell times include, inter alia, 2 to 60 minutes and 15 to 30 minutes.

Steps 66 and 68 of FIG. 2 are to be performed as described supra in conjunction with the first dielectric material embodiment.

Performance of step 70 of FIG. 2 depends on the choice of material for the third dielectric layer 46 and the fourth dielectric layer 48. If the dielectric layers 46 and 48 include a high density interconnect layer such as a resin comprising a modified polyphenylene ether, then step 70 of FIG. 2 is to be performed as described supra in conjunction with the first dielectric material embodiment. However, the dielectric layers 46 and 48 may alternatively include LCP dielectric material. Thus, if one or both of the dielectric layers 46 and 48 include LCP dielectric material, then step 70 of FIG. 2 is to be modified (for whichever or both of dielectric layers 46 and 48 include LCP dielectric material) such that the pressurization and temperature elevation described supra in conjunction with the first dielectric material embodiment is to be replaced by the pressurization and temperature elevation described supra in conjunction with the second dielectric material embodiment for laminating LCP dielectric material to other layers of material. In particular, the lamination temperature T is to be wholly in the liquid crystal temperature range (i.e., $T<T_{NI}$) with no excursion into the isotropic temperature range, under sufficient pressurization (e.g., 1000 to 3000 psi) and for a sufficient dwell time to cause the LCP dielectric material to be effectively laminated to the layer of material. The dwell time for maximum temperature and pressure should generally be at least 2 minutes, and applicable ranges of dwell times include, inter alia, 2 to 60 minutes and 15 to 30 minutes.

Steps 72 and 74 of FIG. 2 are to be performed as described supra in conjunction with the first dielectric material embodiment.

Joining Layer Embodiment

Figure 24:
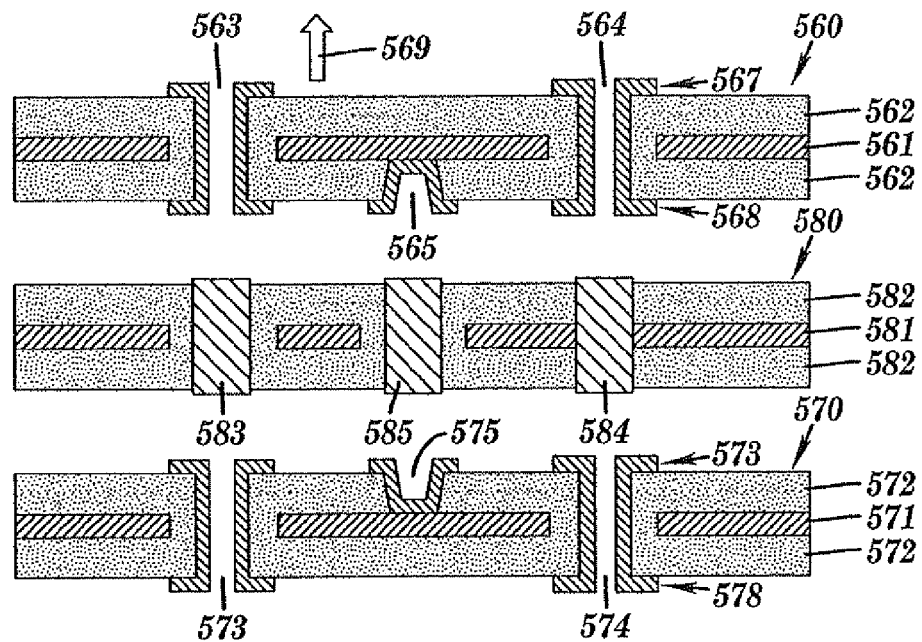
FIGS. 24-25 depict joining two 2S1P substructures with a joining layer, in accordance with embodiments of the present invention.
Figure 25:
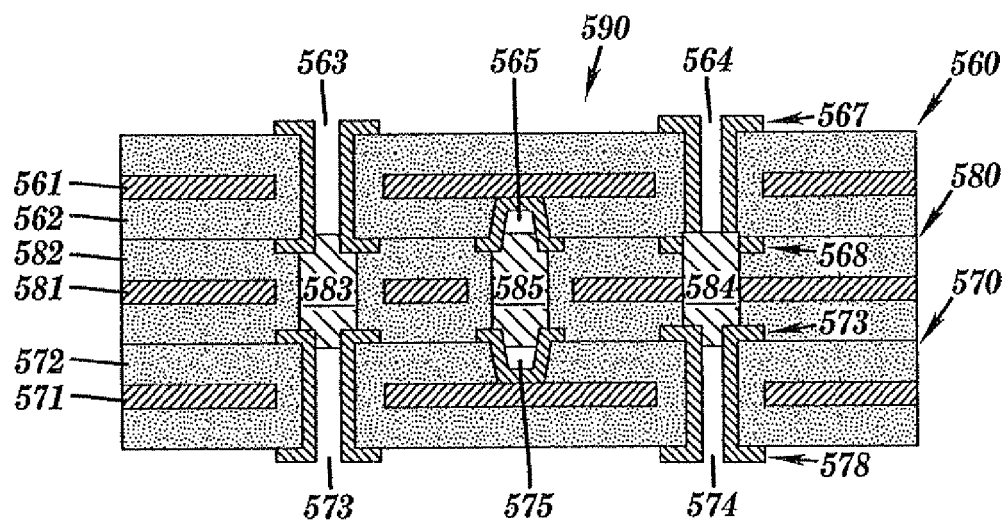

FIGS. 13-25 illustrate using a LCP dielectric layer as a joining layer that mechanically and electrically joins two 2S1P substructures together, in accordance with embodiments of the present invention. A 2S1P substructure comprises a dielectric layer having one power plane within the dielectric layer, and two signal planes on opposing surfaces of the dielectric layer FIGS. 13-19 depict forming a 2S1P substructure. A power plane is characterized by its inclusion of a continuously conductive layer and may include one or more holes within the continuous conductive layer. A signal plane is characterized by its inclusion of a layer comprising electrically conductive circuitry. FIGS. 20-23 depict forming the joining layer. FIGS. 24-25 depict joining two 2S8P substructures with a joining layer.

Using a LCP dielectric layer as a joining layer, rather than using a Rogers 2800 dielectric material (or a partially cured thermoset material) as a joining layer, has several advantages. A first advantage is that the LCP dielectric can be purchased in a copper clad format. This eliminates the need for a first step of laminating copper foil to a dielectric layer. A second advantage is that the LCP dielectric is more stable and tear resistant than is the Rogers 2800 dielectric and can thus be handled in thinner sheets. This avoids the use of extra thick copper for a central power plane, so that there is enhancement of subtractive circuitization and subsequent filling of fine features.

Figure 13:
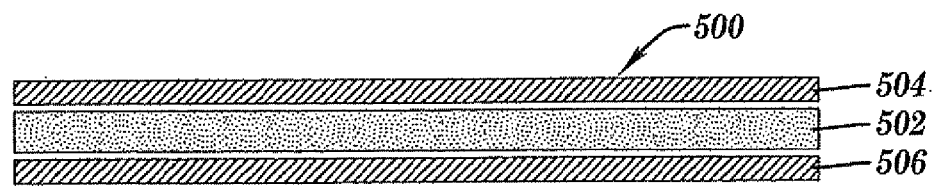
FIGS. 13-19 depict forming a 2S1P substructure, in accordance with embodiments of the present invention.

FIGS. 13-19 depict forming a 2S1P substructure 530. FIG. 13 depicts an electrical structure 500 comprising metal layers 504 and 506 cladded to opposite sides of a dielectric layer 502. The metal layers 504 and 506 may include, inter alia, copper. The dielectric layer 502 may comprise any type of dielectric material known to one of ordinary skill in the art (e.g., organic dielectric material; ceramic dielectric material; LCP dielectric material; non-LCP dielectric material; etc.). Depending on the materials of the dielectric layer 502 and metal layers 504, it may be possible to purchase the electrical structure 500 of FIG. 13 (e.g., copper cladded LCP dielectric material). If the dielectric layer 502 comprises LCP dielectric material then one can laminate sheets of metal (e.g., copper) to the dielectric layer 502 by the methods disclosed supra in conjunction with the second dielectric material embodiment as described supra. Otherwise, the electrical structure 500 may be formed by any method known to one of ordinary skill in the art.

Figure 14:
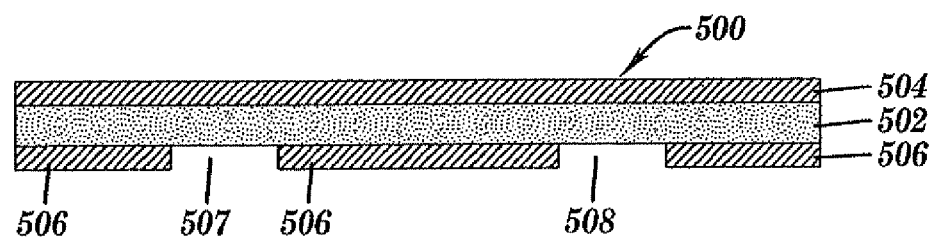

FIG. 14 shows the electrical structure 500 of FIG. 13 after clearance holes 507 and 508 have been formed in the metal layer 506, by any method known to one of ordinary skill in the art (e.g., patterning with photolithography followed by chemical etching).

Figure 15:
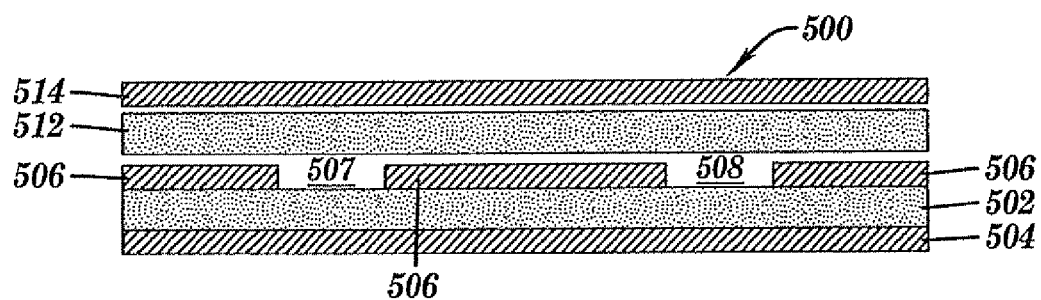

FIG. 15 shows the electrical structure 500 of FIG. 14 after a dielectric layer 512 has been placed on the metal layer 506, and a metal layer 514 has been placed on the dielectric layer 512. The dielectric layer 512 may have any of the characteristics described supra for the dielectric layer 502. The metal layer 514 may have any of the characteristics described supra for the metal layers 504 and 506.

Figure 16:
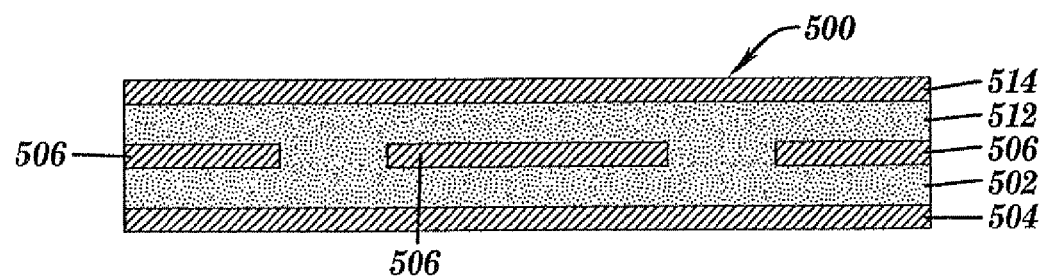

FIG. 16 shows the electrical structure 500 of FIG. 15 after layers 514, 512, 506, and 502 have been laminated together by any of the methods discussed supra in conjunction with forming the electrical structure 500 of FIG. 13, including the methods disclosed supra in conjunction with the second dielectric material embodiment if the dielectric layer 512 comprises LCP dielectric material. FIG. 16 shows that said lamination process caused the clearance holes 507 and 508 of FIG. 15 to be filled with the dielectric material from dielectric layers 502 and 512.

Figure 17:
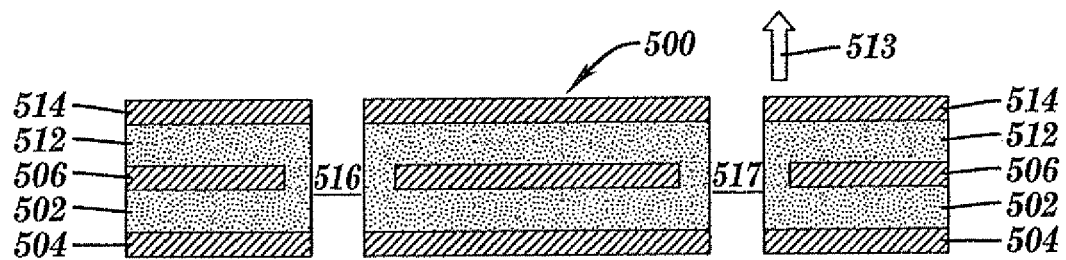

FIG. 17 shows the electrical structure 500 of FIG. 16 after through holes 516 and 517 have been formed through the thickness of the electrical structure 500 in the direction 513, by any method known to one of ordinary skill in the art (e.g., laser ablation).

Figure 18:
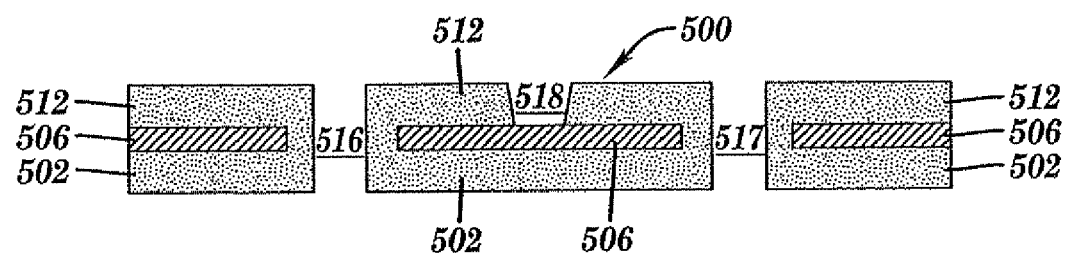

FIG. 18 shows the electrical structure 500 of FIG. 17 after the metal layers 504 and 514 have been removed by any method known to one of ordinary skill in the art (e.g., chemical etching), followed by formation of a blind via 518 in the dielectric layer 512 so as to expose a surface portion of the metal layer 506, by any method known to one of ordinary skill in the art (e.g., patterning with photolithography followed by chemical etching).

Figure 19:
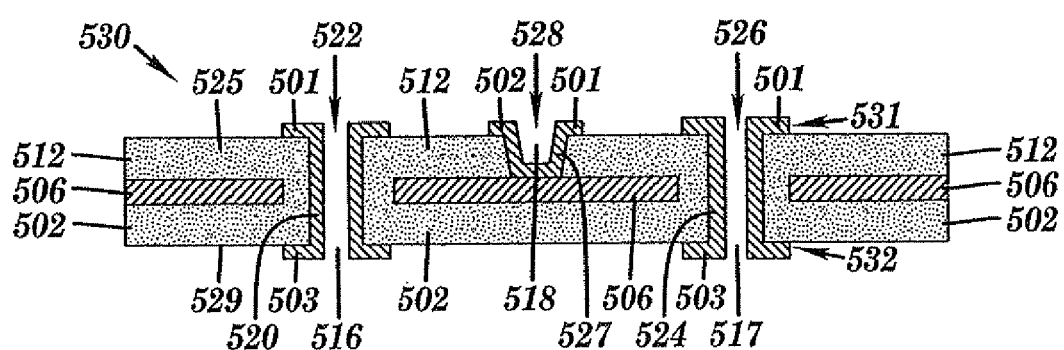

FIG. 19 shows the result of the final step of the transformation of electrical structure 500 into a 2S1P substructure 530, wherein said final step includes formation of plated through hole 522, plated through hole 526, plated blind via 528, signal plane 531, and signal plane 532, by any method known to one of ordinary skill in the art such as electroplating or electroless plating of metal (e.g., copper). For example: plating 520 may be plated on the walls of the through hole 516 to form the plated through hole 522; plating 524 may be plated on the walls of the through hole 517 to form the plated through hole 526; plating 527 may be plated on the walls of the blind via 518 to form the plated blind via 528; plating 501 may be plated on the surface 525 of the dielectric layer 512, said plating 501 being continuous with the plating 520, the plating 524, and the plating 527 to form the signal plane 531; and plating 503 may be plated on the surface 529 of the dielectric layer 502, said plating 503 being continuous with the plating 520 and the plating 524 to form the signal plane 532.

The 2S1P substructure 530 comprises: the signal plane 531 on the surface 525 of the dielectric layer comprising dielectric layers 512 and 502, the signal plane 532 on the surface 529 of the dielectric layer comprising dielectric layers 512 and 502, and a power plane consisting of the metal layer 506 within the dielectric layer comprising dielectric layers 512 and 502.

Figure 20:
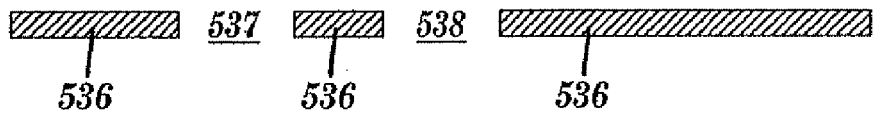
FIGS. 20-23 depict forming a joining layer for joining together two 2S1P substructures, in accordance with embodiments of the present invention.

FIGS. 20-23 depict forming a joining layer 559. In FIG. 20, a metal foil 536 having through holes 537 and 538 is provided.

Figure 21:
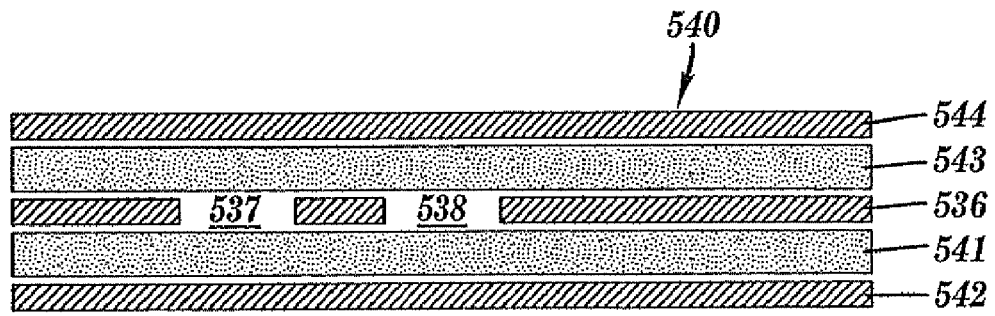

FIG. 21 is derived from FIG. 20 and shows an electrical structure 540 resulting from placing LCP dielectric layers 541 and 543 on opposite sides of the metal foil 536, placing metal layer 542 on the LCP dielectric layer 541, and placing metal layer 544 on the dielectric layer 543. The metal layers 542 and 544 may each have any of the characteristics described supra for the metal layers 504 and 506 of FIG. 13.

Figure 22:
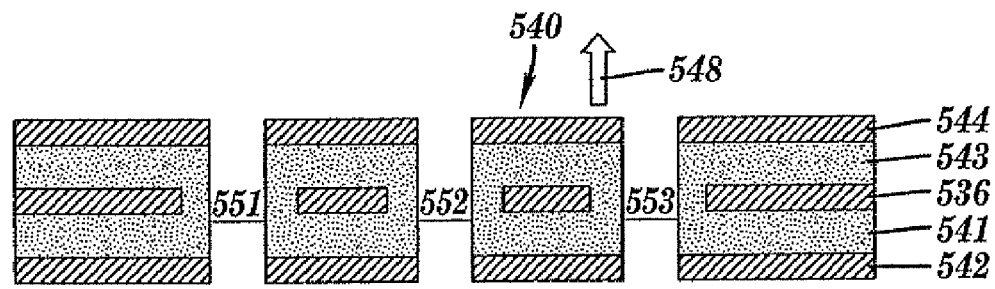

FIG. 22 shows the electrical structure 540 of FIG. 21 after layers 544, 543, 536, 541, and 542 have been laminated together by any of the methods discussed supra in conjunction with the second dielectric material embodiment for bonding LCP material to adjacent layers. In particular, the lamination temperature T is to be wholly in the liquid crystal temperature range (i.e., $T<T_{NI}$) of the LCP dielectric material of dielectric layers 541 and 543 with no excursion into the isotropic temperature range, under sufficient pressurization (e.g., 1000 to 3000 psi) and for a sufficient dwell time to cause the LCP dielectric material of dielectric layers 541 and 543 to be effectively laminated together in the through holes 537 and 538, and to the metal foil 536. The dwell time for maximum temperature and pressure should generally be at least 2 minutes, and applicable ranges of dwell times include, inter alia, 2 to 60 minutes and 15 to 30 minutes. FIG. 22 shows that said lamination process caused the through holes 537 and 538 of FIG. 21 to be filled with the LCP dielectric material of dielectric layers 541 and 543. Following said lamination, through holes 551, 552, and 553 are formed through the thickness of the electrical structure 540 in the direction 548.

Alternatively in FIG. 22, layer structure 546 (which includes metal layer 544, LCP dielectric layer 543, and metal foil 536), may be formed from a copper clad LCP core, and formed into electrical structure 540 by adding LCP dielectric layer 541 and metal layer 542.

Figure 23:
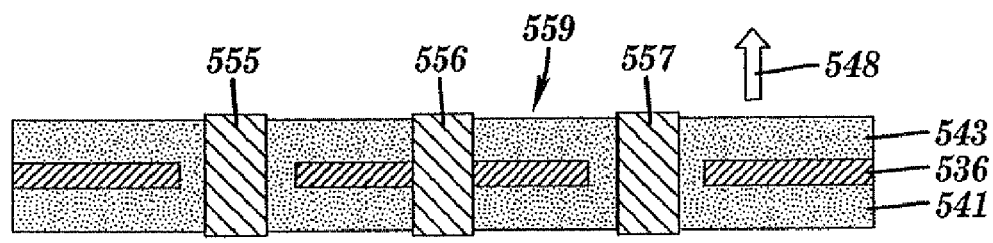

FIG. 23 shows the result of the final step of the transformation of electrical structure 540 into the joining layer 559, wherein said final step includes forming electrically conductive plugs 555, 556, and 557 within, and extending beyond in the direction 548, the through holes 551, 552, and 553, respectively, by any method known to one of ordinary skill in the art, such as by forcing electrically conductive adhesive into the through holes 551, 552, and 553 through use of a squeegee process. The electrically conductive adhesive may comprise an adhesive resin (e.g., epoxy) that contains conductive metal particles. As an example, the electrically conductive adhesive may comprise Ablestick ABLEBOND® 8175 silver-filled paste. The adhesive is squeegeed into the through holes 551, 552, and 553 and smeared onto the continuing exposed surfaces of the metal layers 542 and 544. The adhesive is partially cured (e.g., B-stage cured). The excess partially cured adhesive is next removed, followed by removal of the metal layers 542 and 544 by any method known to one of ordinary skill in the art (e.g., chemical etching), leaving the remaining adhesive extending above and below dielectric layers 541 and 543 in the direction 548. The partially cured adhesive has a consistency of chewing gum at room temperature (i.e., not sticking). Then enough heat is applied to additionally cure and dry the adhesive, leaving the adhesive dry at room temperature.

As an alternative, the sidewalls of through holes 551-553 of FIG. 22 could first be plated with metal (e.g., copper), followed by depositing a surface metal (e.g., tin-gold alloy) that would facilitate bonding to the opposing or aligning plated through hole above and/or below the through holes 551-553. Then the electrically conductive adhesive would be forced into the plated through holes 551-553 to form the electrically conductive plugs 555-557 of FIG. 23.

FIGS. 24-25 depict joining two 2S1P substructures 560 and 570 joined together mechanically and electrically by a joining layer 580 to form a composite electrical structure 590.

FIG. 24 shows the 2S1P substructures 560 and 570 and the joining layer 580 prior to the lamination process. The 2S1P substructure 560 comprises signal planes 567 and 568 on opposing surfaces of dielectric layer 562, power plane 561 within dielectric layer 562, plated through holes 563 and 564 through the thickness of the 2S1P substructure 560 in the direction 569, and plated blind via 565 extending into the dielectric layer 562 and mechanically and electrically contacting the power plane 561. The 2S1P substructure 570 comprises signal planes 577 and 578 on opposing surfaces of dielectric layer 572, power plane 571 within dielectric layer 572, plated through holes 573 and 574 through the thickness of the 2S1P substructure 570 in the direction 569, and plated blind via 575 extending into the dielectric layer 572 and mechanically and electrically contacting the power plane 571. The dielectric layers 562 and 572 may each independently comprise any type of dielectric material known to one of ordinary skill in the art (e.g., organic dielectric material; ceramic dielectric material; LCP dielectric material; non-LCP dielectric material; etc.). The joining layer 580 comprises a LCP dielectric layer 582, a metal layer 581 within the LCP dielectric layer 582, and electrically conductive plugs 583, 584, and 585 extending through and beyond the thickness of the joining layer 580 in the direction 569.

FIG. 25 depicts the resulting composite electrical structure 590 after the 2S1P substructures 560 and 570 have been joined together, mechanically and electrically, by having been each laminated to the joining layer 580. The lamination is accomplished in accordance with the methods of the second dielectric material embodiment for LCP dielectrics, described supra. In particular, the lamination temperature T is to be wholly in the liquid crystal temperature range (i.e., $T<T_{NI}$) of the LCP dielectric material of dielectric layer 582 with no excursion into the isotropic temperature range, under sufficient pressurization (e.g., 1000 to 3000 psi) and for a sufficient dwell time to cause the LCP dielectric material of dielectric layer 582 to be effectively laminated to the dielectric layer 562, the dielectric layer 572, the signal plane 568, and the signal plane 577. The dwell time for maximum temperature and pressure should generally be at least 2 minutes, and applicable ranges of dwell times include, inter alia, 2 to 60 minutes and 15 to 30 minutes. If either or both of the dielectric layers 562 and 572 comprise LCP dielectric material, then the value of $T_{NI}$ to be employed for satisfying $T<T_{NI}$ is the lowest value of $T_{NI}$ of all LCP dielectric materials included within dielectric layers 562, 572, and 582.

FIG. 25 shows that: electrically conductive plug 583 electrically couples plated through hole 563 of the 2S1P substructure 560 to plated through hole 573 of the 2S1P substructure 570; electrically conductive plug 584 electrically couples plated through hole 564 of the 2S1P substructure 560 to plated through hole 574 of the 2S1P substructure 570; and electrically conductive plug 585 electrically couples plated blind via 565 of the 2S1P substructure 560 to plated blind via 575 of the 2S1P substructure 570. Additionally if the plated blind via 575 were replaced by a new plated through hole that does not contact any portion of the metal layer 571, then the conductive plug 585 would electrically couple plated blind via 565 of the 2S1P substructure 570 to said new plated through hole.

Any of the laminations involving LCP dielectric material described herein in conjunction with the joining layer embodiment of the present invention may be performed by use of the flat bed lamination press or the autoclave lamination press as described supra in conjunction with the second dielectric material embodiment, or by use of any other lamination press hardware known to one of ordinary skill in the art that may be used for accomplishing such laminations.

While there have been shown and described what are at present considered the preferred embodiments of this invention, it will be obvious to those skilled in the art that various changes and modifications can be made therein without departing from the scope of the invention as defined by the appended claims.

We claim:

1. An electrical structure, comprising:
   a first 2S1P substructure, comprising a first dielectric layer, a first power plane within the first dielectric layer, a top signal plane on a top surface of the first dielectric layer, a bottom signal plane on a bottom surface of the first dielectric layer, and a first electrically conductive via;
   a second 2S1P substructure, comprising a second dielectric layer, a second power plane within the second dielectric layer, a top signal plane on a top surface of the second dielectric layer, a bottom signal plane on a bottom surface of the second dielectric layer, and a second electrically conductive via;

a joining layer having first and second opposing surfaces and an electrically conductive plug therethrough, wherein the joining layer comprises a liquid crystal polymer (LCP) dielectric material, wherein the first opposing surface of the joining layer is directly bonded to the first dielectric layer of the first 2S1P substructure with no extrinsic adhesive material bonding the joining layer to the first dielectric layer, wherein the second opposing surface of the joining layer is directly bonded to the second dielectric layer of the second 2S1P substructure with no extrinsic adhesive material bonding the joining layer to the second dielectric layer, and wherein the electrically conductive plug electrically couples the first electrically conductive via to the second electrically conductive via, the LCP dielectric material being heated to a temperature less than a liquid crystal transition temperature; and the first electrically conductive via comprises a first plated through hole that electrically couples the top and bottom signal planes of the first 2S1P substructure, and the second electrically conductive via comprises a second plated through hole that electrically couples the top and bottom signal planes of the second 2S1P substructure, the first and second plated through holes being plated along a length of a thickness of each the first and second 2S1P substructures, respectively, and the first and second plated through holes contacting the top and bottom signal planes on the first and second dielectric layers, respectively.

2. The electrical structure of claim 1, wherein the LCP dielectric material comprises a polymer chain structure and associated directional orientation that is essentially the same as the polymer chain structure and associated directional orientation that existed in the LCP dielectric material prior to the bonding of the joining layer to the first and second 2S1P substructures.

3. The electrical structure of claim 1, wherein the LCP dielectric material comprises a coefficient of thermal expansion (CTE) that is essentially the same as the CTE that existed in the LCP dielectric material prior to the bonding of the joining layer to the first and second 2S1P substructures.

4. The electrical structure of claim 1, wherein the first electrically conductive via comprises a first plated blind via that electrically couples the first power plane to the bottom signal plane of the first 2S1P substructure, and wherein the second electrically conductive via comprises a second plated blind via that electrically couples the second power plane to the top signal plane of the second 2S1P substructure.

5. The electrical structure of claim 1, wherein the first electrically conductive via comprises a plated blind via that electrically couples the first power plane to the bottom signal plane of the first 2S1P substructure, and wherein the second electrically conductive via comprises a plated through hole that electrically couples the top and bottom signal planes of the second 2S1P substructure.

6. The electrical structure of claim 1, wherein the first dielectric layer comprises a first LCP dielectric material, and wherein the second dielectric layer comprises a second LCP dielectric material.

7. The electrical structure of claim 1, wherein neither the first dielectric layer nor the second dielectric layer comprise any LCP dielectric material.

8. The multi-layered interconnect structure of claim 1, wherein the temperature is less than about 635° F.

9. The multi-layered interconnect structure of claim 1, wherein the temperature is between about 540° and 635° F.

10. The multi-layered interconnect structure of claim 1, wherein the temperature is less than about 536° F.

11. The multi-layered interconnect structure of claim 1, wherein the temperature is between about 440° F. to 590° F.

* * * * *